United States Patent
Sano et al.

(10) Patent No.: US 9,502,210 B2
(45) Date of Patent: Nov. 22, 2016

(54) ION IMPLANTER, ION IMPLANTATION METHOD, AND BEAM MEASUREMENT APPARATUS

(71) Applicant: Sumitomo Heavy Industries Ion Technology Co., Ltd., Tokyo (JP)

(72) Inventors: Makoto Sano, Ehime (JP); Mitsukuni Tsukihara, Ehime (JP); Haruka Sasaki, Ehime (JP); Kouji Inada, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/821,507

(22) Filed: Aug. 7, 2015

(65) Prior Publication Data
US 2016/0042915 A1    Feb. 11, 2016

(30) Foreign Application Priority Data

Aug. 8, 2014  (JP) .................................. 2014-163051

(51) Int. Cl.
*H01J 37/00*    (2006.01)
*H01J 37/244*   (2006.01)
*H01J 37/317*   (2006.01)

(52) U.S. Cl.
CPC .......... *H01J 37/244* (2013.01); *H01J 37/3171* (2013.01); *H01J 2237/057* (2013.01); *H01J 2237/24405* (2013.01); *H01J 2237/24535* (2013.01); *H01J 2237/303* (2013.01)

(58) Field of Classification Search
CPC ............... H01J 37/244; H01J 37/3005; H01J 37/3171; H01J 2237/24578; H01J 2237/24528; H01J 2237/24535; H01J 2237/04924; H01J 2237/24564; H01J 2237/31711

USPC ........................................... 250/492.1–492.3
See application file for complete search history.

(56) References Cited

U.S. PATENT DOCUMENTS

| | | | |
|---|---|---|---|
| 7,102,146 B2* | 9/2006 | Rathmell | H01J 37/3171 |
| | | | 250/492.1 |
| 2004/0251432 A1 | 12/2004 | Sano et al. | |
| 2007/0120067 A1* | 5/2007 | Rathmell | H01J 37/244 |
| | | | 250/440.11 |
| 2012/0252194 A1 | 10/2012 | Ninomiya et al. | |
| 2013/0092825 A1 | 4/2013 | Ninomiya et al. | |

FOREIGN PATENT DOCUMENTS

| | | |
|---|---|---|
| JP | H04-051443 A | 2/1992 |
| JP | 2005-005098 A | 1/2005 |
| JP | 4962801 B2 | 6/2012 |

(Continued)

*Primary Examiner* — Michael Maskell
(74) *Attorney, Agent, or Firm* — Michael Best & Friedrich LLP

(57) ABSTRACT

An ion implanter includes: a beam deflector that deflects an ion beam passing through a previous stage beam path and outputs the beam to pass through a subsequent stage beam path toward a wafer; a beam filter slit that partially shields the beam traveling through the subsequent stage beam path and allows passage of a beam component having a predetermined trajectory toward the wafer; a dose cup that is disposed between the beam deflector and the beam filter slit and measures a part of the beam exiting from the beam deflector as a beam current; and a trajectory limiting mechanism that is disposed between the beam deflector and the dose cup and prevents a beam component having a trajectory deviated from the predetermined trajectory from being incident to a measurement region of the dose cup.

24 Claims, 19 Drawing Sheets

(56) References Cited

FOREIGN PATENT DOCUMENTS

| | | |
|---|---|---|
| JP | 2012-204327 A | 10/2012 |
| JP | 2013-089409 A | 5/2013 |
| JP | 5263601 B2 | 8/2013 |
| WO | WO-2007/013869 A1 | 2/2007 |

* cited by examiner

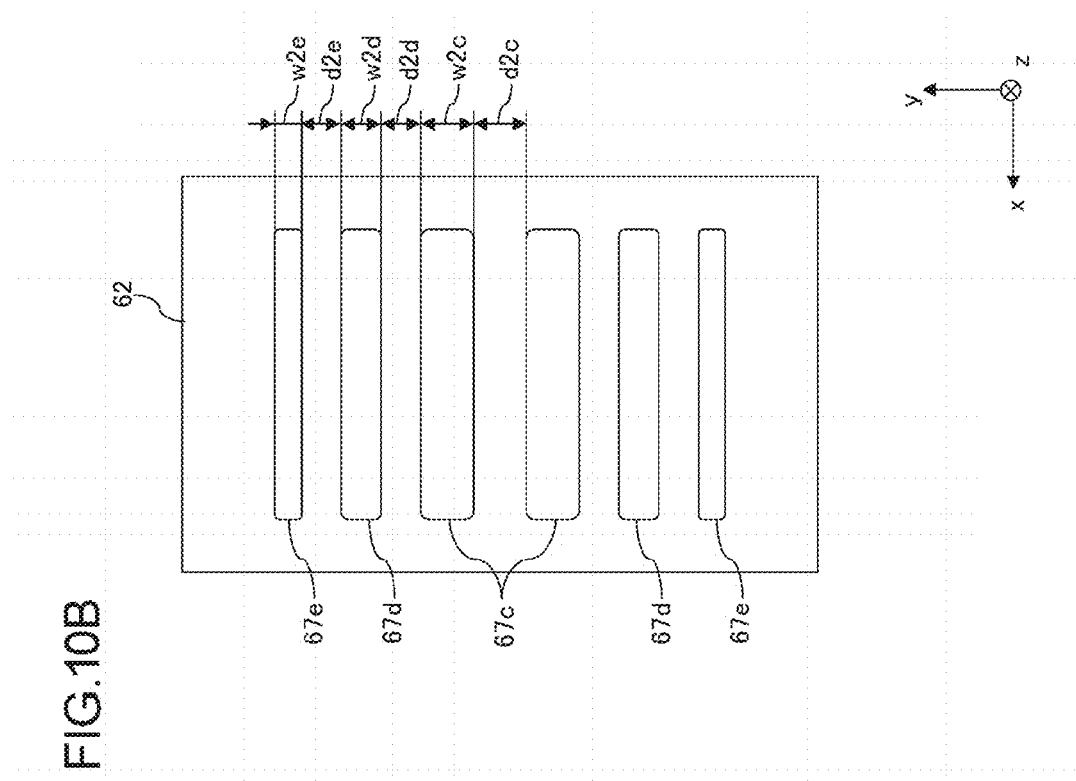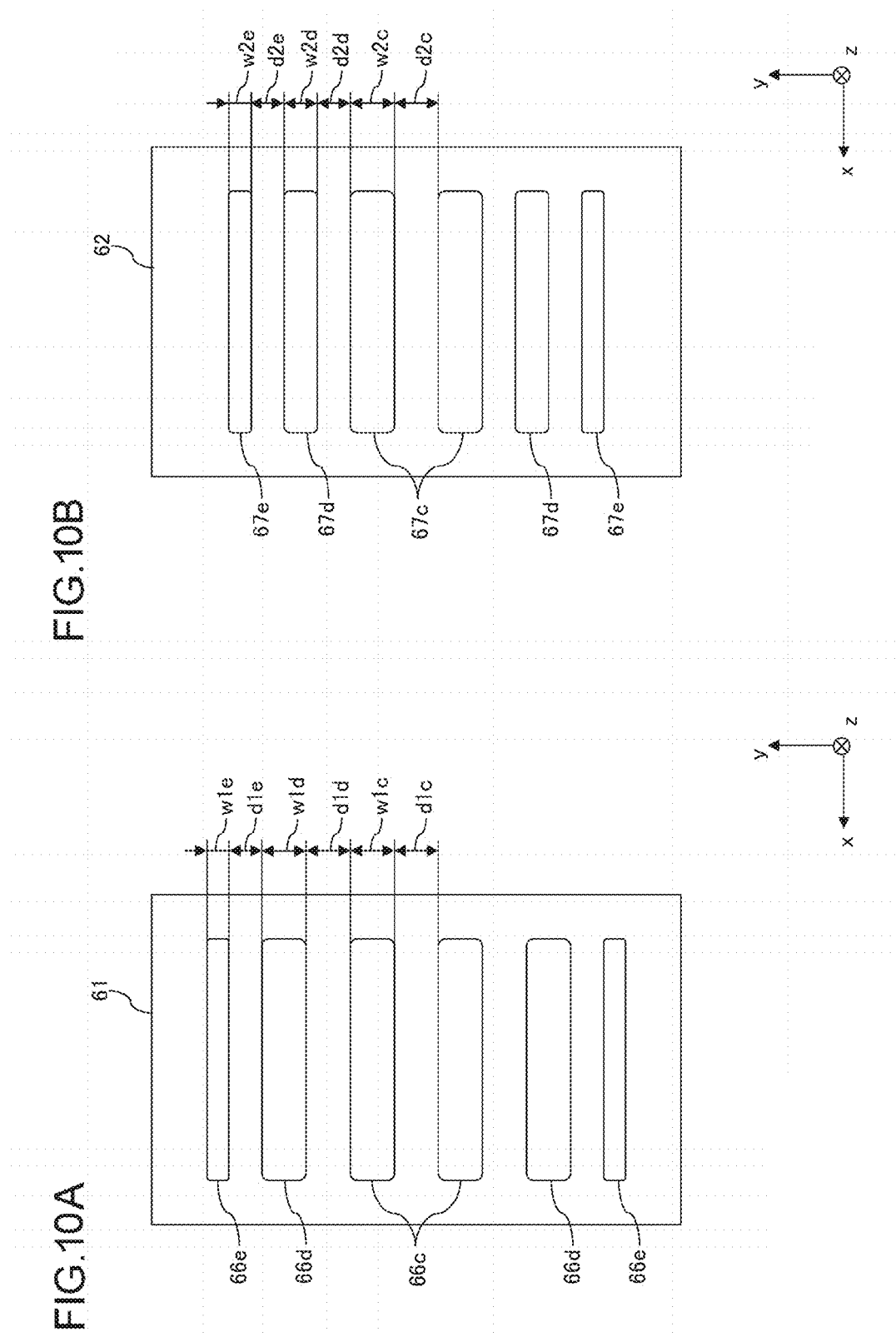

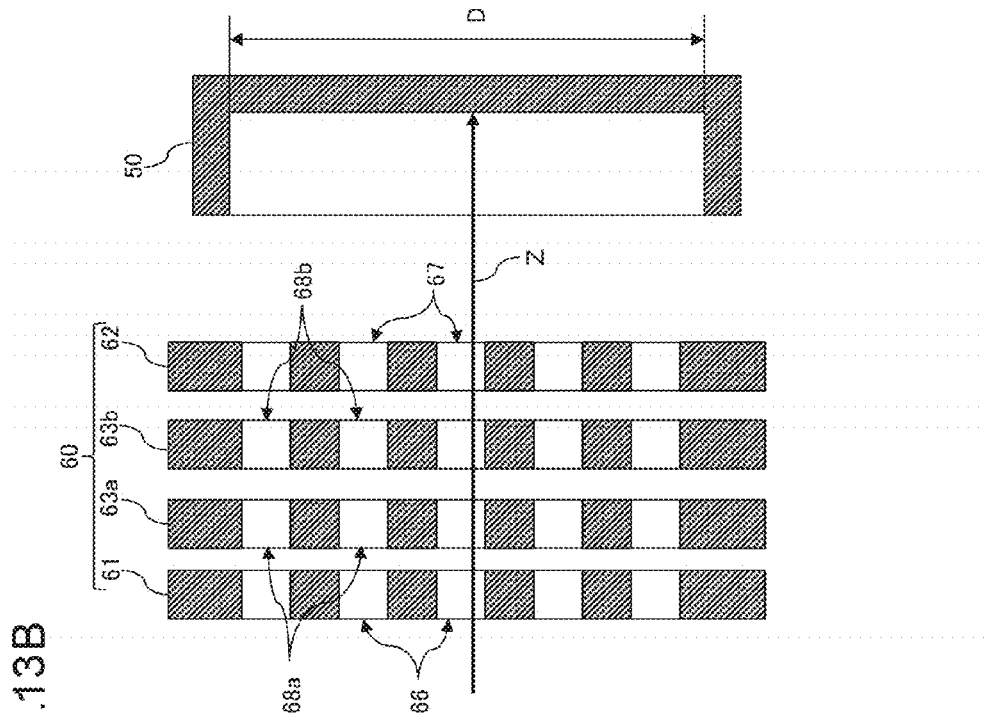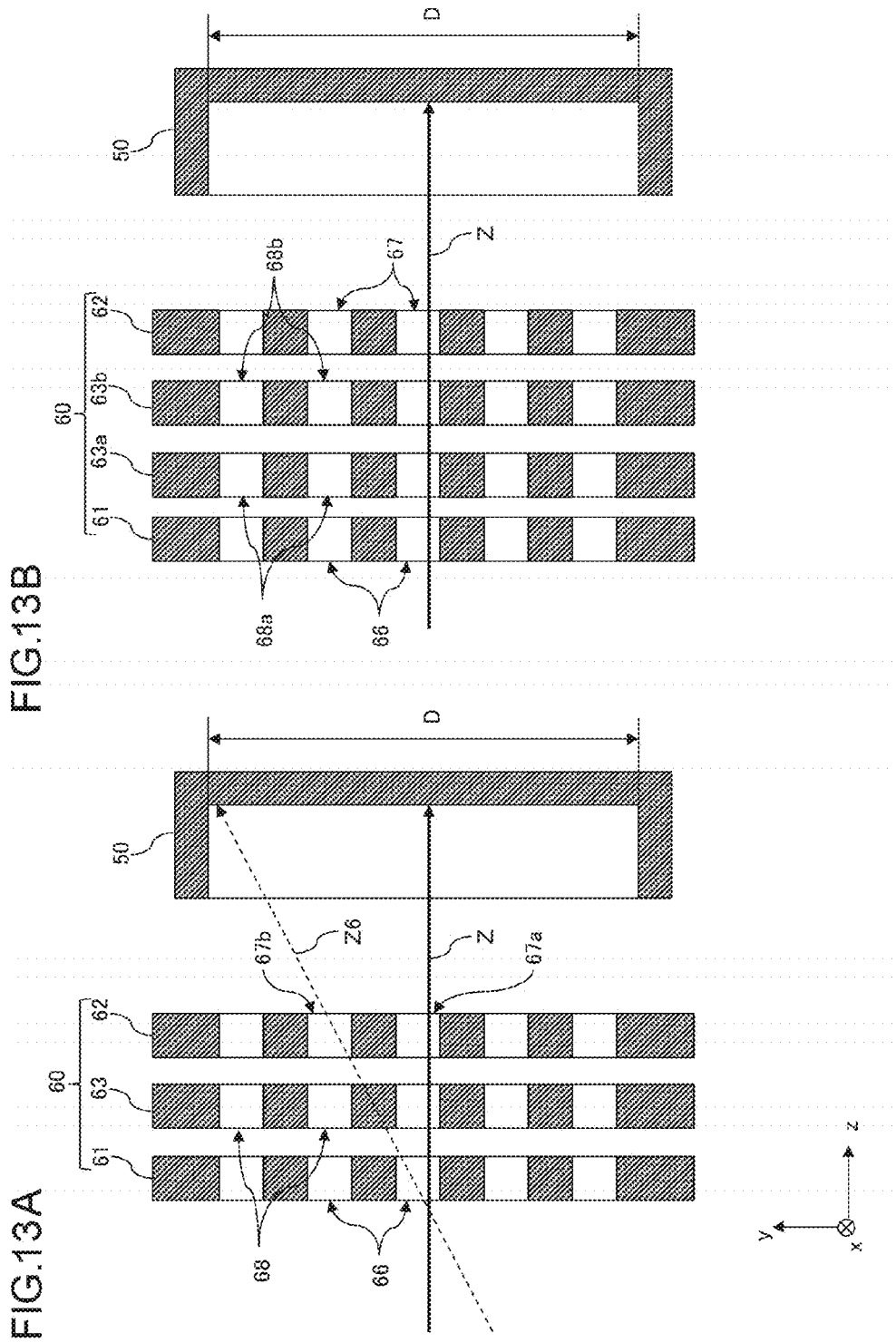

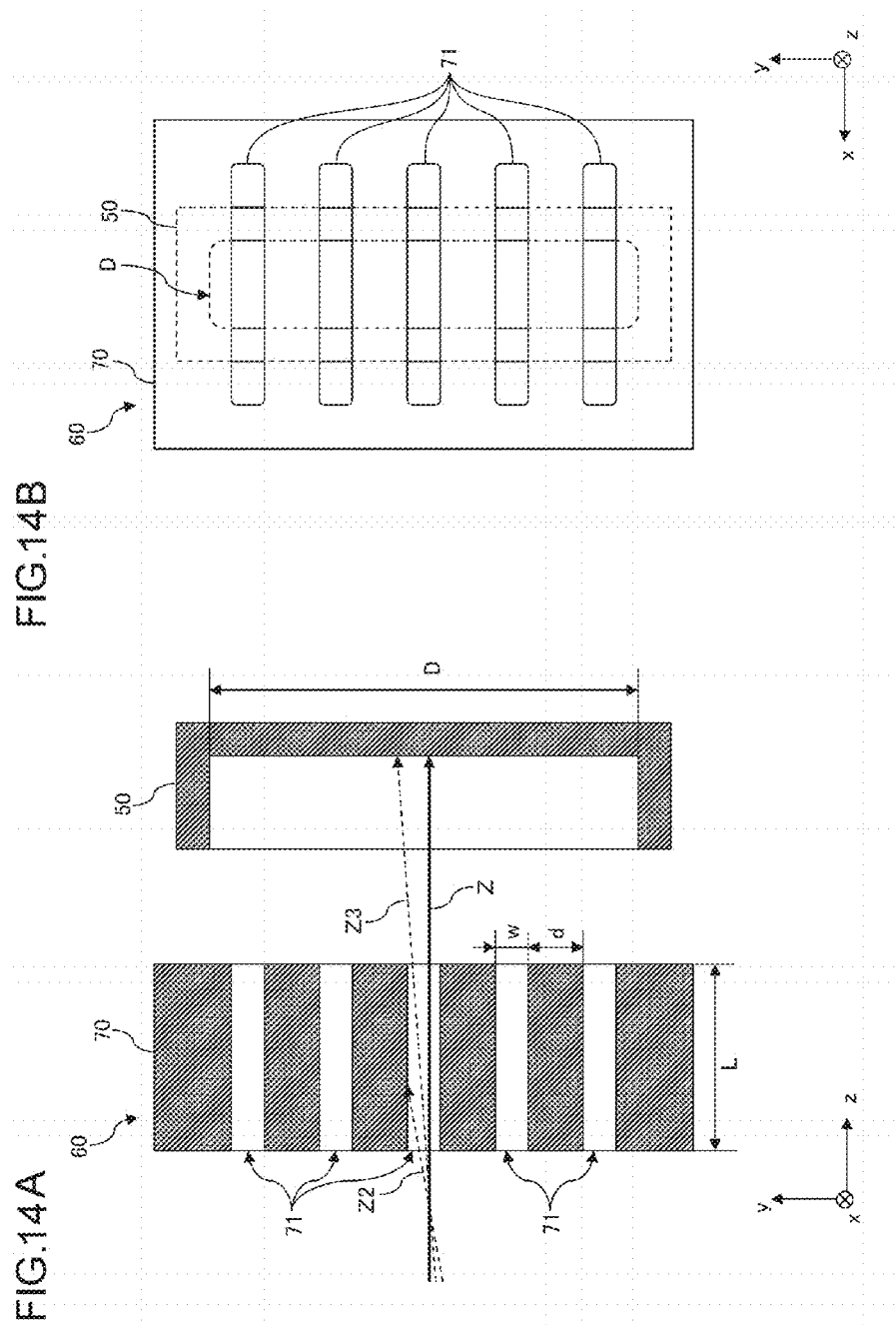

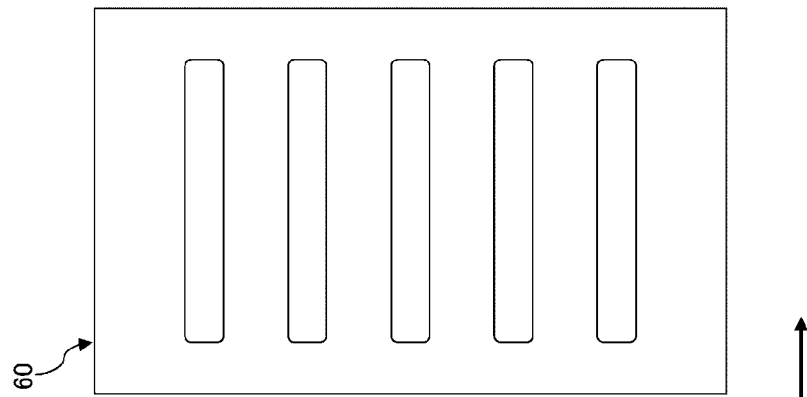
FIG.19B
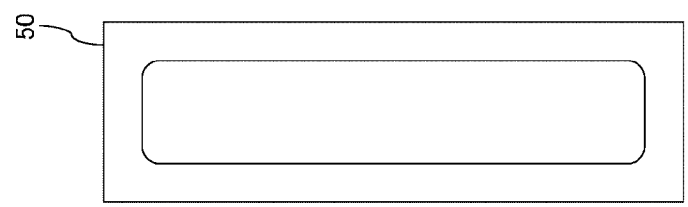
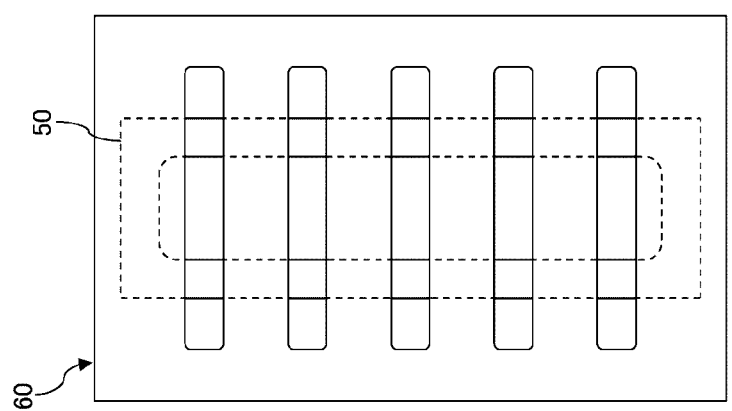
FIG.19A

ION IMPLANTER, ION IMPLANTATION METHOD, AND BEAM MEASUREMENT APPARATUS

RELATED APPLICATION

Priority is claimed to Japanese Patent Application No. 2014-163051, filed on Aug. 8, 2014, the entire content of which is incorporated herein by reference.

BACKGROUND OF THE INVENTION

1. Field of the Invention

The present invention relates to an ion implanter and a beam measurement apparatus.

2. Description of the Related Art

In a semiconductor manufacturing process, a process of implanting ions into a semiconductor wafer (hereinbelow also referred to as "ion implantation process") is normally performed for the purpose of changing conductivity and changing a crystal structure of the semiconductor wafer. An apparatus used for the ion implantation process is referred to as an ion implanter, and the ion implanter has a function of generating ions by an ion source and forming an ion beam by accelerating the generated ions, and a function of transporting the ion beam to a vacuum processing chamber and irradiating a wafer inside the processing chamber with the ion beam.

In the ion implanter, for example, an ion source, a mass analysis magnet device, a beam scanner, a beam collimator, an angular energy filter, a wafer processing chamber and the like are disposed along a beamline and are configured to implant ions into a wafer that is a semiconductor substrate. The angular energy filter deflects the ion beam by the action of an electric field or a magnetic field and guides an ion beam having a desired energy value to the wafer. In addition, a faraday cup is disposed downstream of the angular energy filter such that an ion beam current value can be measured during the ion implantation into the wafer. A part of beam that is not implanted into the wafer is measured.

A photoresist layer for forming circuit patterns may be formed on a surface of a wafer to be processed, and a material constituting the photoresist layer may be decomposed by ion implantation, causing the generation of gas. The generated gas may lower the vacuum degree of a wafer processing chamber or a beamline and change a charge state of ion constituting a beam by interacting with an ion beam directed toward the wafer. When the charge state of ion is changed, an aspect of the interaction between a beam and an electric field or a magnetic field applied by an energy filter or the like may be changed and the beam may deviate from a trajectory assumed in the design. Since a beam component of a trajectory deviating from the trajectory directed toward the wafer may be a measurement target according to the arrangement of the faraday cup, a control of an ion implantation amount may be affected.

SUMMARY OF THE INVENTION

An illustrative object of an aspect of the present invention is to provide a technology that accurately measures a beam component having a predetermined trajectory.

In order to solve the above-described problems, an ion implanter according to an aspect of the present invention includes: a beam deflector that deflects an ion beam incident through a previous stage beam path in a y direction by action of either or both of an electric field and a magnetic field and outputs the beam to pass through a subsequent stage beam path extending in a z direction toward a wafer; a beam filter slit that is disposed on the subsequent stage beam path between the beam deflector and the wafer, partially shields the beam traveling through the subsequent stage beam path toward the wafer, and allows passage of a beam component toward the wafer, the beam component having a predetermined trajectory among beam components of the beam passing through the subsequent stage beam path; a dose cup that is disposed between the beam deflector and the beam filter slit and measures a part of the beam exiting from the beam deflector as a beam current; and a trajectory limiting mechanism that is disposed between the beam deflector and the dose cup and prevents a beam component having a trajectory deviated from the predetermined trajectory, among beam components of the beam that exits from the beam deflector and is directed toward the dose cup, from being incident to a measurement region of the dose cup.

Another aspect of the present invention is an ion implantation method. The method is an ion implantation method using an ion implanter. The ion implanter includes: a beam deflector that deflects an ion beam incident through a previous stage beam path in a y direction by action of either or both of an electric field and a magnetic field and outputs the beam to pass through a subsequent stage beam path extending in a z direction toward a wafer; a beam filter slit that is disposed on the subsequent stage beam path between the beam deflector and the wafer, partially shields the beam traveling through the subsequent stage beam path toward the wafer, and allows passage of a beam component toward the wafer, the beam component having a predetermined trajectory among beam components of the beam passing through the subsequent stage beam path; and a dose cup that is disposed between the beam deflector and the beam filter slit and measures a part of the beam exiting from the beam deflector as a beam current. The method including measuring a beam incident to the dose cup through a trajectory limiting mechanism that is disposed between the beam deflector and the dose cup and prevents a beam component having a trajectory deviated from the predetermined trajectory, among beam components of the beam that exits from the beam deflector and is directed toward the dose cup, from being incident to a measurement region of the dose cup.

A further another aspect of the present invention is an ion implantation apparatus. The apparatus includes: a faraday cup that is capable of measuring a beam current of an ion beam; and a trajectory limiting mechanism that is disposed in the entrance of the faraday cup and prevents a beam component having a trajectory deviated from a predetermined trajectory from being incident to a measurement region of the faraday cup. The trajectory limiting mechanism includes a first mask member having one or more first openings and a second mask member having one or more second openings, the first mask member and the second mask member are disposed to face each other in the beam traveling direction and prevent a beam component having a trajectory other than a trajectory capable of passing through both of the first openings and the second openings from being incident to the measurement region of the faraday cup.

Optional combinations of the aforementioned constituting elements, and implementations of the invention in the form of methods, apparatuses, and systems, may also be practiced as additional modes of the present invention.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which:

FIG. 10A is a front view schematically illustrating a configuration of a first mask member 61 according to a modified example 1, FIG. 10B is a front view schematically illustrating a configuration of a second mask member 62 according to a modified example 1;

FIGS. 13A and 13B are cross-sectional views schematically illustrating a configuration of a trajectory limiting mechanism according to a modified example 2;

FIG. 14A is a cross-sectional view schematically illustrating a configuration of a trajectory limiting mechanism according to a modified example 3, and FIG. 14B is a front view schematically illustrating the configuration of the trajectory limiting mechanism according to the modified example 3;

FIGS. 19A and 19B are a front views schematically illustrating a configuration of a trajectory limiting mechanism according to a modified example 8.

DETAILED DESCRIPTION OF THE INVENTION

Figure 1:
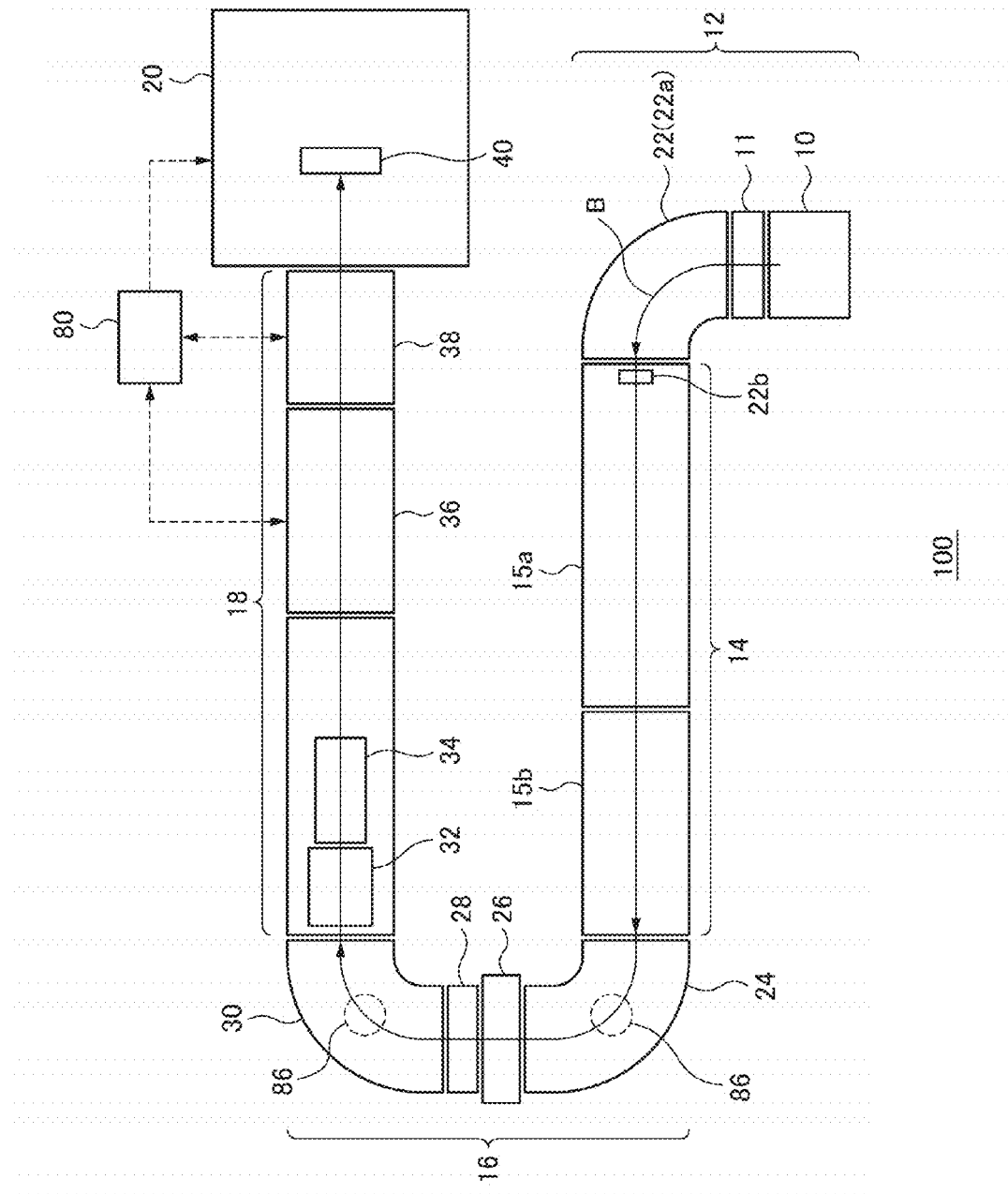
FIG. 1 is a schematic top view of an ion implanter according to the present embodiment.

The invention will now be described by reference to the preferred embodiments. This does not intend to limit the scope of the present invention, but to exemplify the invention.

Hereinbelow, embodiments of the present invention will be described in detail with reference to the drawings. The same reference sign will be assigned to the same element in the drawings, and duplicate description thereof will not be presented as is appropriate. The configurations described below are merely examples but are not for purposes of limiting the scope of the present invention.

FIG. 1 is a schematic top view of an ion implanter 100 according to an embodiment of the present invention. FIG. 1 shows a layout of components constituting a beamline unit of the ion implanter 100. The beamline unit of the ion implanter 100 includes an ion source 10 and a processing chamber for a workpiece and is configured to transport an ion beam B from the ion source 10 to the workpiece (e.g., a substrate or a wafer 40).

In this document, for convenience of description, a beam traveling direction is referred to as a z direction, and a direction perpendicular to the z direction is referred to as an x direction. Also, a direction perpendicular to the z direction and the x direction is referred to as a y direction. In the present embodiment, the x direction is a horizontal direction while the y direction is a vertical direction.

The ion implanter 100 is applied to a so-to-speak high energy ion implanter. The high energy ion implanter is an ion implanter that includes a radio frequency linear acceleration type ion accelerator and a high energy ion transportation beamline. The high energy ion implanter is configured to accelerate ions generated by the ion source 10 to have high energy, transports the ions along a beamline to the workpiece as the ion beam B, and implants the ions into the workpiece.

As illustrated in FIG. 1, the ion implanter 100 includes an ion beam generation unit 12 that generates ions and separates the ions by mass, a high energy multistage linear acceleration unit 14 that accelerates an ion beam so as to become a high energy ion beam, a beam deflection unit 16 that bends a trajectory of the high energy ion beam in a U shape, a beam transportation line unit 18 that transports the high energy ion beam to the wafer 40, and a substrate processing/supplying unit 20 that uniformly implants the transported high energy ion beam into the semiconductor wafer.

The ion beam generation unit 12 includes the ion source 10, an extraction electrode 11, and a mass analyzer 22. In the ion beam generation unit 12, a beam is extracted from the ion source 10 through the extraction electrode 11 and is accelerated, and the extracted and accelerated beam is subjected to amass analysis by the mass analyzer 22. The mass analyzer 22 includes a mass analysis magnet 22a and a mass analysis slit 22b. There is a case in which the mass analysis slit 22b is disposed directly behind the mass analysis magnet 22a. However, in the embodiment, the mass analysis slit 22b is disposed inside the entrance of the next component, the high energy multistage linear acceleration unit 14.

Only the ion species necessary for the implantation are selected as a result of the mass analysis using the mass analyzer 22, and the ion beam of the selected ion species is led to the next high energy multistage linear acceleration unit 14. The high energy multistage linear acceleration unit 14 includes a first linear accelerator 15a including a plurality of basic stages of radio frequency resonators for high energy ion implantation. The high energy multistage linear acceleration unit 14 may include a second linear accelerator 15b including a plurality of additional stages of radio frequency resonators for ultra-high energy ion implantation. The direction of the ion beam accelerated by the high energy multistage linear acceleration unit 14 is changed by the beam deflection unit 16.

The high energy ion beam that exits from the radio frequency (AC-type) high energy multistage linear acceleration unit 14 for highly accelerating the ion beam has a certain range of energy spread. For this reason, in order to scan and collimate the high energy ion beam emitted from the high energy multistage linear acceleration unit 14 and irradiate it in the wafer moving in a reciprocating motion, there is a need to perform a highly accurate energy analysis, center trajectory correction, and beam focusing/defocusing adjustment in advance.

The beam deflection unit 16 performs the energy analysis, and the center trajectory correction on the high energy ion beam. The beam deflection unit 16 includes at least two highly accurate deflection electromagnets, at least one energy spread confining slit, an energy analysis slit, and at least one horizontal focusing unit. The plurality of deflection electromagnets are arranged so as to perform the energy analysis of the high energy ion beam, and to correct the ion implantation angle accurately.

The beam deflection unit 16 includes an energy analysis electromagnet 24, a horizontal focusing quadrupole lens 26 that suppresses energy dispersion, an energy analysis slit 28, and a steering electromagnet 30 providing steering (trajectory correction). The energy analysis electromagnet 24 is one at the most upstream side out of the plurality of deflection electromagnets in the beam deflection unit 16. The steering electromagnet 30 is one at the most downstream side out of the plurality of deflection electromagnets in the beam deflection unit 16. Meanwhile, the energy analysis electromagnet 24 may be called an energy filter electromagnet (EFM). The direction of the high energy ion beam is changed by the beam deflection unit 16 so as for the beam to be directed toward the wafer 40.

The ions that pass through the deflection electromagnets of the beam deflection unit 16 are subjected to a centrifugal force and a Lorentz force, and hence draws a circular-arc trajectory by balance of these forces. This balance is represented by a relation of mv=qBr. Here, m indicates the mass of the ion, v indicates the velocity of the ion, q indicates the electric charge of the ion, B indicates the magnetic flux density of the deflection electromagnet, and r indicates the curvature radius of the trajectory. Only the ions in which the curvature radius r of the trajectory matches the curvature radius of the magnetic center of the deflection electromagnet may pass through the deflection electromagnet. In other words, in a case in which the ions have the same electric charge, the ions that may pass through the deflection electromagnet applied with the uniform magnetic field B are only the ions having the specific momentum mv. The EFM is called the energy analysis electromagnet, but is actually a device that is used to analyze the momentum of the ion. A bending magnet (BM) or a mass analysis electromagnet of an ion generation unit is a momentum filter.

Further, the beam deflection unit 16 may deflect the ion beam by 180° just by using a plurality of magnets. Accordingly, the high energy ion implanter in which the beamline has a U shape may be achieved with a simple configuration.

As described above, the beam deflection unit 16 performs the deflection of the ion beam by 180° by using a plurality of electromagnets between the high energy multistage linear acceleration unit 14 and the beam transportation line unit 18 in the ion implanter that accelerates the ions generated from the ion source and transports the ions to the wafer so as to implant the ions thereto. The energy analysis electromagnet 24 and the steering electromagnet 30 are respectively formed so as to have deflection angles of 90°. As a result, the total deflection angle becomes 180°. Furthermore, the amount of the deflection performed by each magnet is not limited to 90°, and the following combination may be available.

(1) One magnet having deflection amount of 90° and two magnets having deflection amounts of 45°
(2) Three magnets having deflection amounts of 60°
(3) Four magnets having deflection amounts of 45°
(4) Six magnets having deflection amounts of 30°
(5) One magnet having deflection amount of 60° and one magnet having deflection amount of 120°
(6) One magnet having deflection amount of 30° and one magnet having deflection amount of 150°

Since the energy analysis electromagnet 24 needs high magnetic field precision, a highly accurate magnetic field measurement device 86 for accurately measuring the magnetic field is provided. The measurement device 86 is appropriate combination of an NMR (nuclear magnetic resonance) probe, which may be referred to as an MRP (magnetic resonance probe), and a Hall probe. The MRP is used to calibrate the Hall probe, and the Hall probe is used in a feedback control for a constant magnetic field. Further, the energy analysis electromagnet 24 is produced with strict precision so that the magnetic field uniformity becomes less than 0.01%. Similarly, the steering electromagnet 30 is provided with a magnetic field measurement device 86. The magnetic field measurement device 86 of the steering electromagnet 30 may be provided with a Hall probe only. Further, each of the energy analysis electromagnet 24 and the steering electromagnet 30 is connected with a power supply and its control device that provide current setting precision and current stability of $1\times10^{-4}$ or less.

The beam transportation line unit 18 is used to transport the ion beam B exiting from the beam deflection unit 16, and includes a beam focusing/defocusing device 32 formed by a focusing/defocusing lens group, a beam scanner 34, a beam collimator 36, and an electrostatic final energy filter 38 (with a final energy separation slit). The length of the beam transportation line unit 18 is designed so as to match the total length of the ion beam generation unit 12 and the high energy multistage linear acceleration unit 14. The beam transportation line unit 18 is connected to the high energy multistage linear acceleration unit 14 via the beam deflection unit 16 so as to form a U-shaped layout as a whole.

Figure 2:
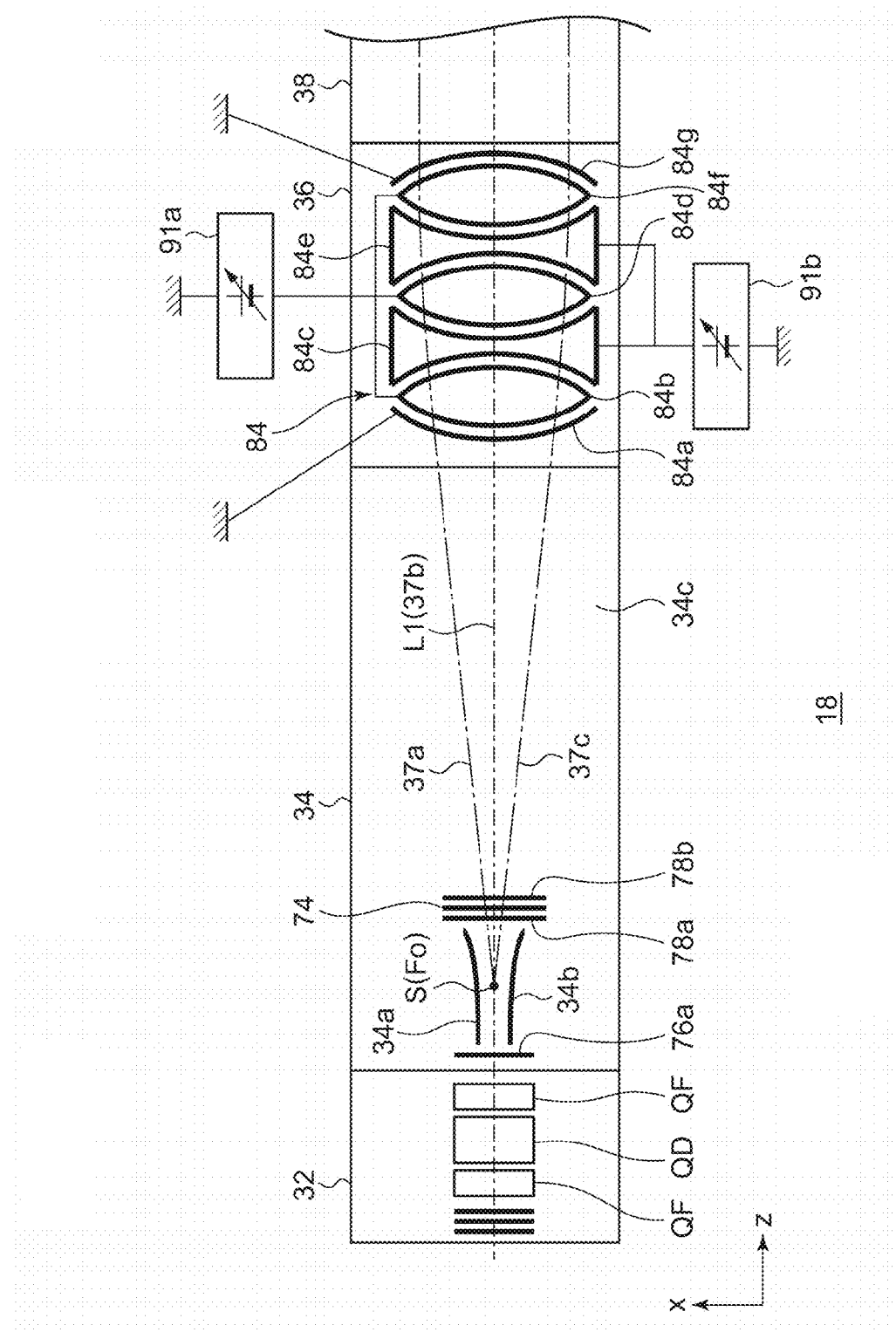
FIG. 2 is a plan view illustrating a partial schematic configuration of a beam transportation line unit illustrated in FIG. 1.

FIG. 2 is a plan view illustrating a partial schematic configuration of the beam transportation line unit 18. Ions which have desired mass and desired energy separated by the beam deflection unit 16 (refer to FIG. 1) and other devices which are disposed upstream side of the beam deflection unit is focused/defocused in a desired cross-sectional shape by the beam focusing/defocusing device 32. As illustrated in the figure, the beam focusing/defocusing device 32 is configured as (an electric field type or a magnetic field type) focusing/defocusing lens group such as a Q (quadrupole) lens. The beam having a focused/defocused cross-sectional shape is scanned in a direction parallel to the surface of FIG. 2 by the beam scanner 34. For example, the beam focusing/defocusing device is configured as a triplet Q lens group including a horizontal focusing (vertical defocusing) lens QF/a horizontal defocusing (a vertical focusing) lens QD/a horizontal focusing (a vertical defocusing) lens QF. If necessary, the beam focusing/defocusing device 32 may be configured by each of the horizontal focusing lens QF and the horizontal defocusing lens QD or the combination thereof.

The beam scanner 34 is configured to scan the ion beam by deflecting the ion beam in the x direction at a scan origin S at a periodically changing deflection angle. The scan origin S is an intersection point of an extension line L1 (37b) of an entrance beam trajectory to the beam scanner 34 and extension lines of exit beam trajectories 37a and 37c from the beam scanner 34.

The beam scanner 34 is a deflection scan device that causes the ion beam to be periodically scanned in the horizontal direction perpendicular to the ion beam traveling direction in a reciprocating manner by the periodically changing electric field. As illustrated in FIG. 2, the beam scanner 34 includes a pair of (two) scan electrodes 34a and 34b (bipolar deflection scan electrodes) that are disposed so as to face each other with the ion beam passage region interposed therebetween in the beam traveling direction. Then, a scan voltage that changes to positive and negative values at a predetermined frequency in the range of 0.5 Hz to 4000 Hz and is approximated to the triangular wave is applied to the two scan electrodes 34a and 34b with polarity of the voltage being opposite each other. The scan voltage generates a changing electric field that deflects the beam passing through the gap between the two scan electrodes 34a and 34b. Then, the beam that passes through the gap is scanned in the horizontal direction by the periodic change of the scan voltage.

A suppression electrode 74 that has an opening in the ion beam passage region is disposed between two ground electrodes 78a and 78b at the downstream side of the beam scanner 34. A ground electrode 76a is disposed before the scan electrodes at the upstream side thereof, but if necessary, a suppression electrode having the same configuration as that of the downstream side may be disposed. The suppression electrode suppresses the intrusion of electrons to the positive electrode.

A beam scan space portion 34c is provided in a long section at the downstream side of the beam scanner 34 inside a scan housing, and hence a sufficient scan width at the entrance of the beam collimator 36 may be obtained even when the beam scan angle is narrow. At the rear side of the scan housing located at the downstream side of the beam scan space portion 34c, the beam collimator 36 is installed such that the scanned ion beam is deflected to be directed to the direction of the ion beam before the beam is scanned. That is, the beam collimator 36 bends the beam again so as to be parallel to the beamline L1.

Since the aberration (a difference in focal length between the center portion of the beam collimator and right/left end) generated in the beam collimator 36 is proportional to the square of the deflection angle of the beam scanner 34, the aberration of the beam collimator 36 may be largely suppressed when the beam scan space portion 34c is increased in length and the deflection angle is decreased. If the aberration is large, the center portion and the right/left end of the semiconductor wafer have different beam sizes and beam divergence angles when the ion beam is implanted into the semiconductor wafer, and hence the quality of the product becomes non-uniform.

Further, when the length of the beam scan space portion 34c is adjusted, the length of the beam transportation line unit may match the length of the high energy multistage linear acceleration unit 14.

The beam collimator 36 is configured to collimate the ion beam incident from the beam scanner 34 and a beam passage region extends along the x direction (the horizontal direction) at the downstream of the beam collimator 36. The beam collimator 36 is an electrostatic beam collimator, for example.

The beam collimator 36 is provided with an electric field collimating lens 84. As illustrated in FIG. 2, the collimating lens 84 includes a plurality of pairs of acceleration electrodes and a plurality of pairs of deceleration electrodes substantially having a hyperbolic shape. The electrodes of each pair face each other across an acceleration or deceleration gap interposed therebetween and having a width not causing a discharge. An electric field generated in an acceleration or deceleration gap has a longitudinal element along the reference trajectory and a horizontal element perpendicular to the reference trajectory on the xz plane. The horizontal element perpendicular to the reference trajectory is strengthened in proportional to a distance from the reference trajectory in the x direction. The ion beam is focused in the horizontal direction by the electric field.

The downstream electrode in the pair of electrodes with the acceleration gap interposed therebetween and the upstream electrode of the deceleration gap are formed as an integrated structure, and the downstream electrode of the deceleration gap and the upstream electrode of the next acceleration gap are formed as an integrated structure, so as to have the same potential.

From the upstream side of the collimating lens 84, the first electrode (the entrance electrode) 84a and the final electrode (the exit electrode) 84g are maintained at the ground potential. Accordingly, the energy of the beam at the positions before and behind the collimating lens 84 does not change.

In the intermediate electrode structure of the collimating lens 84, first electrode assemblies 84b, 84d, and 84f constituting the exit electrode of the acceleration gap and the entrance electrode of the deceleration gap are connected with a negative power supply 91a for applying a variable constant voltage to the collimating lens. In addition, second electrode assemblies 84c and 84e constituting the exit electrode of the deceleration gap and the entrance electrode of the acceleration gap are connected with a positive power supply 91b for applying a variable constant voltage to the collimating lens. Accordingly, the ion beam is gradually directed toward the direction parallel to the reference trajectory of the beamline while being accelerated and decelerated repeatedly. Finally, the ion beam reaches the trajectory parallel to the ion beam traveling direction (the beamline trajectory direction) before the deflection scanning operation.

As illustrated in FIG. 2, the beam collimator 36 has a focal point $F_0$ on the reference trajectory (e.g., the beamline L1 illustrated in FIG. 2). A plurality of beam trajectories 37a, 37b, and 37c incident to the beam collimator 36 respectively have different angles from the reference trajectory. The beam collimator 36 is designed to deflect each of the plurality of beam trajectories 37a, 37b, and 37c at a different deflection angle in accordance with the incident angle so that the plurality of beam trajectories 37a, 37b, and 37c is parallel to the reference trajectory. The beam collimator 36 is operated when it receives electric input (e.g., voltage)

predetermined in accordance with predetermined conditions of ion implantation (e.g., conditions including target beam energy).

The plurality of beam trajectories 37a, 37b, and 37c are on a plane containing the reference trajectory, on which the beam trajectories 37a, 37b, and 37c are respectively directed from the focal point $F_0$ to the beam collimator 36 at different incident angles. Since the plurality of beam trajectories 37a, 37b, and 37c are results of scanning by the beam scanner 34 in the present embodiment, this plane is equivalent to a scan plane (an xz plane) of the beam scanner 34. Any of the beam trajectories (the beam trajectory 37b in FIG. 2) may correspond to the reference trajectory. In the present embodiment illustrated in FIG. 2, the reference trajectory is not deflected in the beam collimator 36 but goes straight in the beam collimator 36.

The ion implanter 100 according to the present embodiment is configured so that the focal point $F_0$ of the beam collimator 36 corresponds to the scan origin S of the beam scanner 34. Accordingly, the beam that is scanned by the beam scanner 34 at the scan origin S converges by the beam collimator 36 including the electric field collimating lens and the like and becomes parallel to the axis (the reference axis) of the deflection angle 0° parallel to the ion beam traveling direction (the beamline trajectory direction) before the scan operation. At this time, the scan region is formed so as to be bilaterally symmetrical to each other with respect to the reference axis.

In this manner, the beam transportation line unit 18 scans and collimates the high energy ion beam. The collimated ion beam is supplied via the final energy filter 38 to the substrate processing/supplying unit 20. The wafer 40 moving in a reciprocating motion in a direction perpendicular to the beam scan direction and intersecting with the beam traveling direction is irradiated with the collimated ion beam with high precision, and the ions are implanted to the wafer 40.

Figure 3A:
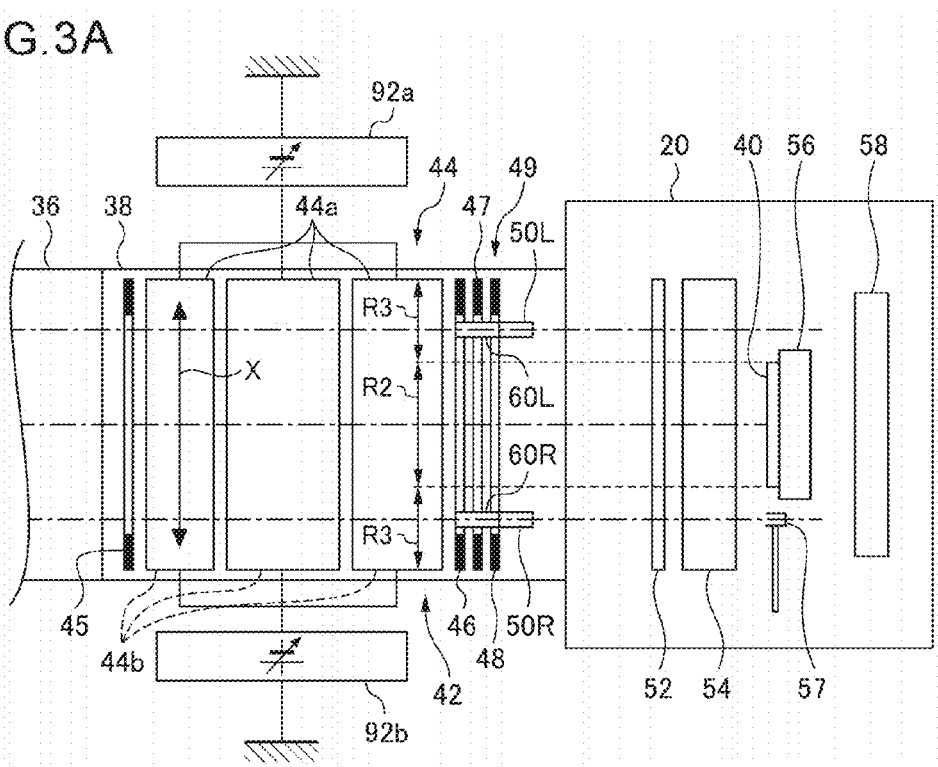
FIG. 3A is a top view illustrating a schematic configuration of a final energy filter and a substrate processing/supplying unit.
Figure 3B:
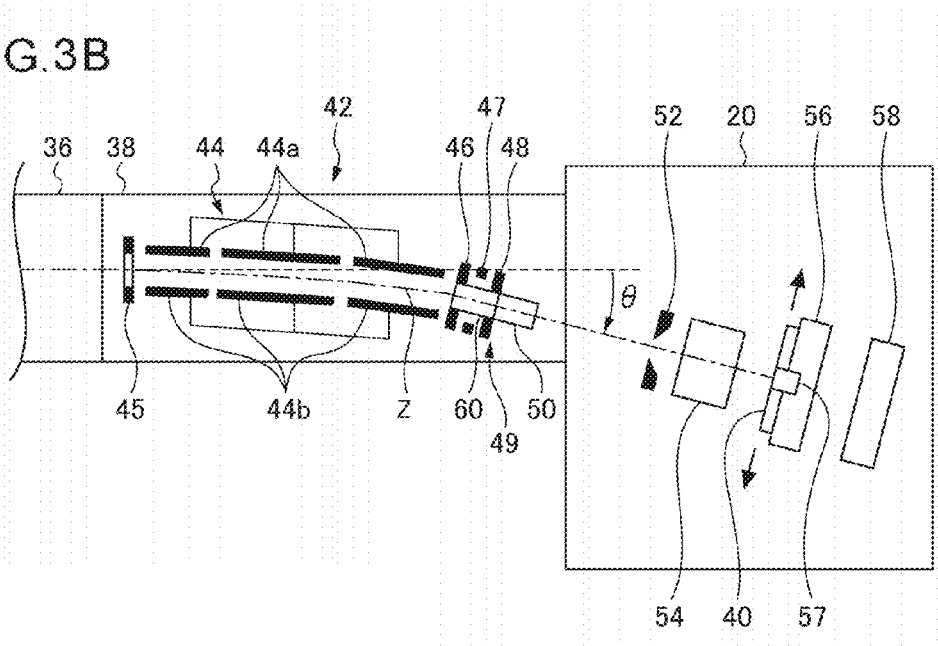
FIG. 3B is a side view illustrating the schematic configuration of the final energy filter and the substrate processing/supplying unit.

FIG. 3A is a top view illustrating the schematic configuration of the final energy filter 38 and the substrate processing/supplying unit 20, and FIG. 3B is a side view illustrating the schematic configuration of the final energy filter 38 and the substrate processing/supplying unit 20. The ion beam exiting from the beam collimator 36 is sent to the final energy filter 38 (the angular energy filter (AEF)). In the final energy filter 38, a final analysis is performed on the energy of the ion beam to be directly implanted into the wafer, only the ion species having a necessary energy value are selected, and the neutralized particles having no electric charge or the ions having different charge states are removed.

The final energy filter 38 includes a beam deflector 42 that deflects the traveling direction by the action of either or both of the electric field and the magnetic field on the ion beam. In the present embodiment, the case using the electric field type beam deflector 42 is provided, but the beam deflector 42 may be a magnetic field type and may be a combination of the electric field type and the magnetic field type.

The beam deflector 42 is configured as a plate-shaped deflection electrode (AEF electrode device) 44 including at least one pair of plane or curved surfaces facing each other in the vertical direction of the beamline trajectory direction. The AEF electrode device 44 is curved downward by the deflection action of the beam deflector 42 itself in the vertical direction of the beamline trajectory direction and is curved so as to match the ion beam trajectory.

As illustrated in FIG. 3B, the AEF electrode device 44 is configured as at least one pair of AEF electrodes and is disposed so that the ion beam is interposed from the vertical direction. In the at least one pair of AEF electrodes, a positive power supply 92a for the AEF electrode is connected to the upper AEF electrode 44a so as to apply a positive voltage, and a negative power supply 92b for the AEF electrode is connected to the lower AEF electrode 44b so as to apply a negative voltage. During the deflection by the electric field, the ion beam is deflected downward by an angle θ of about 10 to 20° by the action of the electric field generated between the AEF electrodes 44a and 44b, and hence only the ion beam having target energy is selected. In addition, only the ion beam having a charge state selected in the final energy filter 38 is deflected downward at the set trajectory angle θ. The wafer 40 as the irradiation target is uniformly irradiated with ion beam that is formed by the ion species selected in this way at an accurate angle.

In a case where the high-energy beam is actually deflected, at least one pair of plate-shaped AEF electrode devices 44 facing each other in the vertical direction is divided into n number of segments (n is an integer equal to or greater than 2) in the back-and-forth direction in accordance with the deflection angle and the curvature radius when the AEF electrode devices 44 are curved so as to match the ion beam trajectory as illustrated in FIG. 3B. Thus, the production precision or the economic efficiency is excellent in the plate-shaped electrode of which the upper electrode and the lower electrode are maintained at the same potential. For example, the AEF electrode devices 44 are divided into three segments as illustrated. Further, the plate-shaped deflection electrode that is divided into n number of segments in the back-and-forth direction may be formed as n number of upper and lower plate-shaped electrodes paired vertically and set to different potentials other than the configuration in which the upper electrode and the lower electrode are maintained at the same potential.

With such a structure, the electric field type energy filter may be mounted on the high-energy scan beam transportation line. Since the beam is deflected in a direction perpendicular to the beam scan plane by the electric field, the energy analysis may be performed without influencing the implantation ion density distribution (the uniformity) in the beam scan direction.

Further, due to the mounting of the final energy filter 38, the beamline is equipped with three kinds of beam filters, that is, the radio frequency linear accelerator of the high energy multistage linear acceleration unit 14, the energy analysis electromagnet 24 of the beam deflection unit 16 and the steering electromagnet 30, and the final energy filter 38. As described above, the high energy multistage linear acceleration unit 14 is the velocity (v) filter, the beam deflection unit 16 is the momentum (mv) filter, and the final energy filter 38 is the energy ($mv^2/2$) filter as its name implies. In this way, when the different triple filters are used, a very pure ion beam that has high energy purity compared to the related art and has a small amount of particles or metal contamination may be supplied to the wafer.

In terms of function, the energy analysis electromagnet 24 may remove the energy contamination sneaking through the high energy multistage linear acceleration unit 14 or may limit the energy width with high resolution. In addition, the final energy filter 38 which has comparatively low resolution may mainly removes the ions subjected to a change in a charge state in the resist outgas by the beam transportation line unit after the energy analysis using the energy analysis electromagnet 24.

The beam deflector 42 includes a ground electrode 45 that is provided at the upstream side of the AEF electrode device 44 and a suppression electrode device 49 that is provided at the downstream side. The suppression electrode device 49 includes an upstream ground electrode 46, a downstream ground electrode 48, and a suppression electrode 47 disposed between the upstream ground electrode 46 and the downstream ground electrode 48. The suppression electrode device 49 suppresses the intrusion of the electrons to the upper AEF electrode 44a to which the positive voltage is applied.

In the present specification, a passage through which the ion beam incident to the beam deflector 42 passes is also referred to as a "previous stage beam path", and a passage through which the ion beam exiting from the beam deflector 42 passes is also referred to as a "subsequent stage beam path". The traveling direction of the ion beam passing through the previous stage beam path and the traveling direction of the ion beam passing through the subsequent stage beam path are deviated in the y direction by the action of the electric field generated by the AEF electrode device 44, and the deflection angle θ is about 10 to 20°.

In addition, the ion beam incident to the beam deflector 42 is a spot-shaped beam having a width in the x direction and the y direction and is configured by a plurality of ions having various trajectories. Each of the ions constituting the beam has substantially the same trajectory as the beam trajectory Z illustrated in FIG. 3B, but may also have a trajectory deviated from the beam trajectory Z. In the present specification, in order to distinguish the ions having a specific trajectory among the ions constituting the beam directed toward the wafer 40, the ions are referred to as a "beam component having a certain trajectory". The "beam component" means a group of ions or implanted particles constituting a part of the beam.

Dose cups 50 (50L, 50R) are respectively disposed at the left and right ends of the suppression electrode device 49 at the most downstream side of the final energy filter 38. The dose cups 50 are configured by faraday cups capable of measuring the beam current. In the present embodiment, the configuration having both the left dose cup 50L and the right dose cup 50R respectively disposed on the left and right sides is provided, but in a modified example, only one faraday cup may be disposed on one of the left and right sides as the dose cups 50. In the present specification, the left dose cup 50L disposed on the left side is referred to as a first dose cup, and the right dose cup 50R disposed on the right side is referred to as a second dose cup.

The dose cups 50 are disposed in the end region R3 at the outside of the valid implantation region R2 where the ion implantation with respect to the wafer is effectively performed. The ion beam scanned by the beam scanner 34 is scanned over the irradiation region X including the valid implantation region R2 and the end region R3. Therefore, the dose cup 50 can measure a part of the ion beam directed toward the end region R3, without blocking the ion beam directed toward the valid implantation region R2 of the wafer 40. By using the beam current value measured by the dose cups 50, it is possible to estimate the irradiation amount of the ions implanted into the wafer 40 and control the amount of ions implanted into the wafer 40.

In the entrance of the dose cups 50, trajectory limiting mechanisms 60 (60L, 60R) are provided to limit the trajectory of the beam capable of entering the dose cups 50. The trajectory limiting mechanisms 60 are disposed at the position between the beam deflector 42 and the dose cups 50 on the subsequent stage beam path, for example, at the position of the suppression electrode device 49. The trajectory limiting mechanisms 60 may be provided separately from the suppression electrode device 49, or may be provided integrally with the suppression electrode device 49. In a case where the trajectory limiting mechanisms 60 are integrated with the suppression electrode device 49, the trajectory limiting mechanisms 60 are configured as an opening disposed in at least one of the upstream ground electrode 46 and the downstream ground electrode 48.

Among the beam components of the beam that exits from the beam deflector 42 and is directed toward the dose cups 50, a beam component having a trajectory deviated from a predetermined trajectory is prevented from entering the measurement regions of the dose cups 50 by the trajectory limiting mechanisms 60. The term "predetermined trajectory" used herein is a beam trajectory through which the beam can pass through the beam filter slit 52 disposed in the substrate processing/supplying unit 20 after passing through the final energy filter 38 and be incident to the wafer 40. The trajectory limiting mechanisms 60 prevent the dose cups 50 from measuring the beam component having the trajectory deviated from the predetermined trajectory that can be incident to the wafer 40, that is, the trajectory that cannot be incident to the wafer 40. By measuring the beam component capable of being incident to the wafer 40 by the dose cups 50, it is possible to accurately estimate the ion irradiation amount. The trajectory of the beam capable of being incident to the wafer 40 or the trajectory deviated from the predetermined trajectory are separately described in detail.

The substrate processing/supplying unit 20 is disposed at the downstream of the final energy filter 38. A beam filter slit 52, a plasma shower 54, a reciprocating mechanism 56, a profiler cup 57, and a beam monitor 58 are disposed in the implantation processing chamber of the substrate processing/supplying unit 20. The wafer 40 subjected to the ion implantation is set to the reciprocating mechanism 56.

The beam filter slit 52 is an energy defining slit (EDS) configured as a slit that is laterally long in the beam scan direction (x direction). The beam filter slit 52 partially shields the beam traveling toward the wafer through the subsequent stage beam path and allows passage of the beam component having the predetermined trajectory in the subsequent stage beam path. Thereby, only the ion beam having a meaningful energy value and a meaningful charge state and passing through the AEF is separated by limiting the passage of the ion beam having a non-meaningful energy value and a non-meaningful charge state. Therefore, the beam filter slit 52 performs energy analysis of the ion beam incident to the wafer 40 along with the final energy filter 38.

The plasma shower 54 supplies low-energy electrons to the front of the wafer 40 and the ion beam in response to the beam current amount of the ion beam, and suppresses the charge-up of the positive charge generated on the surface of the wafer 40 by the ion implantation. The reciprocating mechanism 56 holds the wafer 40 during the ion implantation and moves the wafer 40 in a direction (y direction) perpendicular to the beam scan direction at a velocity corresponding to a change in the beam current being implanted.

The profiler cup 57 measures the beam current at the ion implantation position. The profiler cup 57 measures the ion beam density at the ion implantation position in the beam scan range before the ion implantation. In a case where the predicted non-uniformity (PNU) of the ion beam does not satisfy the request of the process as a result of the beam profile measurement, the PNU is adjusted to satisfy the process condition by correcting the control function of the application voltage of the beam scanner 34. Further, the profiler cup 57 may be configured to measure the beam shape, the beam width, or the beam center position at the implantation position or check the implantation angle or the beam divergence angle by the combination with the movable aperture.

The beam monitor 58 is a lateral elongated faraday cup with a beam current measurement function capable of measuring the ion beam in the scan range in the wafer region and is disposed at the most downstream side of the beamline. The beam monitor 58 is configured to measure the final setup beam. In order to reduce the cross contamination, the beam monitor 58 may include a changeable bottom surface of a faraday cup of a triple surface structure capable of changing three surfaces of a triangular prism in response to the ion species. Further, the beam monitor 58 may be configured to measure the beam shape or the vertical beam position and monitor the implantation angle or the beam divergence angle in the vertical direction at the implantation position.

As illustrated in FIG. 1, the ion implanter 100 includes a control device 80 that controls all or part of the ion implanter 100 (for example, all or part of the beamline part). The control device 80 estimates the beam irradiation amount incident to the wafer during the implantation process and controls the dose amount to the wafer, based on the measurement result of the dose cup 50 disposed in the final energy filter 38 or the profiler cup 57 and the beam monitor 58 disposed in the substrate processing/supplying unit 20.

The control device 80 acquires the beam current value measured by the dose cup 50 and the profiler cup 57 before the beam irradiation to the wafer and previously obtains the correlation of both. The control device 80 acquires the beam current value measured by the dose cup 50 during the beam irradiation to the wafer and calculates the beam irradiation amount incident to the wafer position by using the previously obtained correlation. When the profiler cup 57 is disposed at the wafer position, the beam directed toward the valid implantation region R2 is blocked. Thus, it is difficult to directly measure the beam irradiation amount at the wafer position during the ion implantation process. The control device 80 estimates the beam irradiation amount incident to the wafer during the implantation process, without affecting the implantation process to the wafer, by using the beam current value measured by the dose cup 50 disposed at the position where the beam directed toward the valid implantation region R2 is not blocked.

The control device 80 adjusts the reciprocating velocity of the wafer by the reciprocating mechanism 56, based on the estimated beam irradiation amount and performs control such that the irradiation amount of the beam with which the wafer is irradiated and the irradiation amount distribution have desired values. In a case where the calculated beam irradiation amount is increased, the reciprocating velocity of the wafer is increased so that the dose amount at which the wafer is irradiated at a position is not increased. On the other hand, in a case where the calculated beam irradiation amount is decreased, the reciprocating velocity of the wafer is decreased so that the dose amount at which the wafer is irradiated at a position is not decreased. In this way, the control device 80 controls the dose amount over the time for which the ion implantation process is performed, such that a desired dose amount and a desired dose amount distribution are realized over the entire surface of the wafer.

When estimating the beam irradiation amount, the control device 80 may perform the process of correcting the influence of deteriorating the vacuum degree during the implantation process. A photoresist layer for forming circuit patterns may be formed on a surface of a wafer to be processed, and a material constituting the photoresist layer may be decomposed by ion implantation, causing the generation of gas called resist outgas. The generated gas may lower the vacuum degree of the wafer processing chamber or the beamline and change the charge state of ion constituting the beam by interacting with the ion beam directed toward the wafer. Since the dose cup 50 measures the current value based on the charge of ion, a difference occurs in the correspondence relationship between the current value and the number of ions if a change in the charge state of ion occurs. For example, when singly charged ion is neutralized by causing the charge state change, the neutral particle is not measured by the dose cup 50. Then, a difference occurs between the actual beam amount (corresponding to the dose amount) incident to the dose cup 50 and the beam amount derived from the measured current value.

In order to correct the influence of deviation of the beam amount derived by the deterioration of the vacuum degree (hereinbelow referred to as pressure compensation), the control device 80 may correct the beam amount by using a predetermined compensation coefficient. The value of the compensation coefficient may be calculated by the control device 80, based on the measurement result of the partial pressure value of the introduction gas intentionally and routinely introduced into the beamline part or the partial pressure value of the resist outgas incidentally generated from the resist film on the surface of the wafer by the ion implantation, or the result of the beam current measurement performed at the same time as the measurement of the partial pressure value.

In the present embodiment, in order to suppress the influence of causing the difference between the actual beam amount (corresponding to the dose amount) incident to the dose cup 50 and the beam amount derived from the measured beam current value due to the resist outgas, the position of the dose cup 50 is disposed away from the wafer 40. When estimating the beam irradiation amount incident to the wafer 40 to which the implantation process is being performed, it may be desirable that the dose cup 50 is disposed in the vicinity of the wafer 40 and the beam is measured. However, the density of the resist outgas is high in the vicinity of the wafer 40, and the change in the charge state of ion is great due to the resist outgas. Therefore, in the present embodiment, as illustrated in FIGS. 3A and 3B, the dose cup 50 is disposed at the more upstream side than the beam filter slit 52 and is disposed in the vicinity of the beam deflector 42 between the beam deflector 42 and the beam filter slit 52.

On the other hand, by disposing the dose cup 50 in the vicinity of the downstream side of the beam deflector 42, the beam component having the trajectory that is not incident to the wafer can be incident to the dose cup 50. Apart of the beam that exits from the beam deflector 42 and travels through the subsequent stage beam path is shielded by the beam filter slit 52, and only the beam component having the predetermined trajectory passes through the beam filter slit 52 and is incident to the wafer. If the dose cup is disposed at the more downstream side than the beam filter slit 52, the beam component that is shielded by the beam filter slit 52 is not incident to the dose cup and only the beam component directed toward the wafer becomes the measurement target. However, when the dose cup 50 is disposed at the more upstream side of the beam filter slit 52, the beam component having the trajectory shielded by the beam filter slit 52, that is, the beam component having the trajectory that is not incident to the wafer, is included in the measurement target. Thus, the beam component that must not be the measurement target is measured by the dose cup 50, and the calculation result of the beam irradiation amount estimated by the control device 80 is influenced. The beam component that influences the estimation of the beam irradiation amount will be described with reference to FIGS. 4 and 5.

Figure 4:
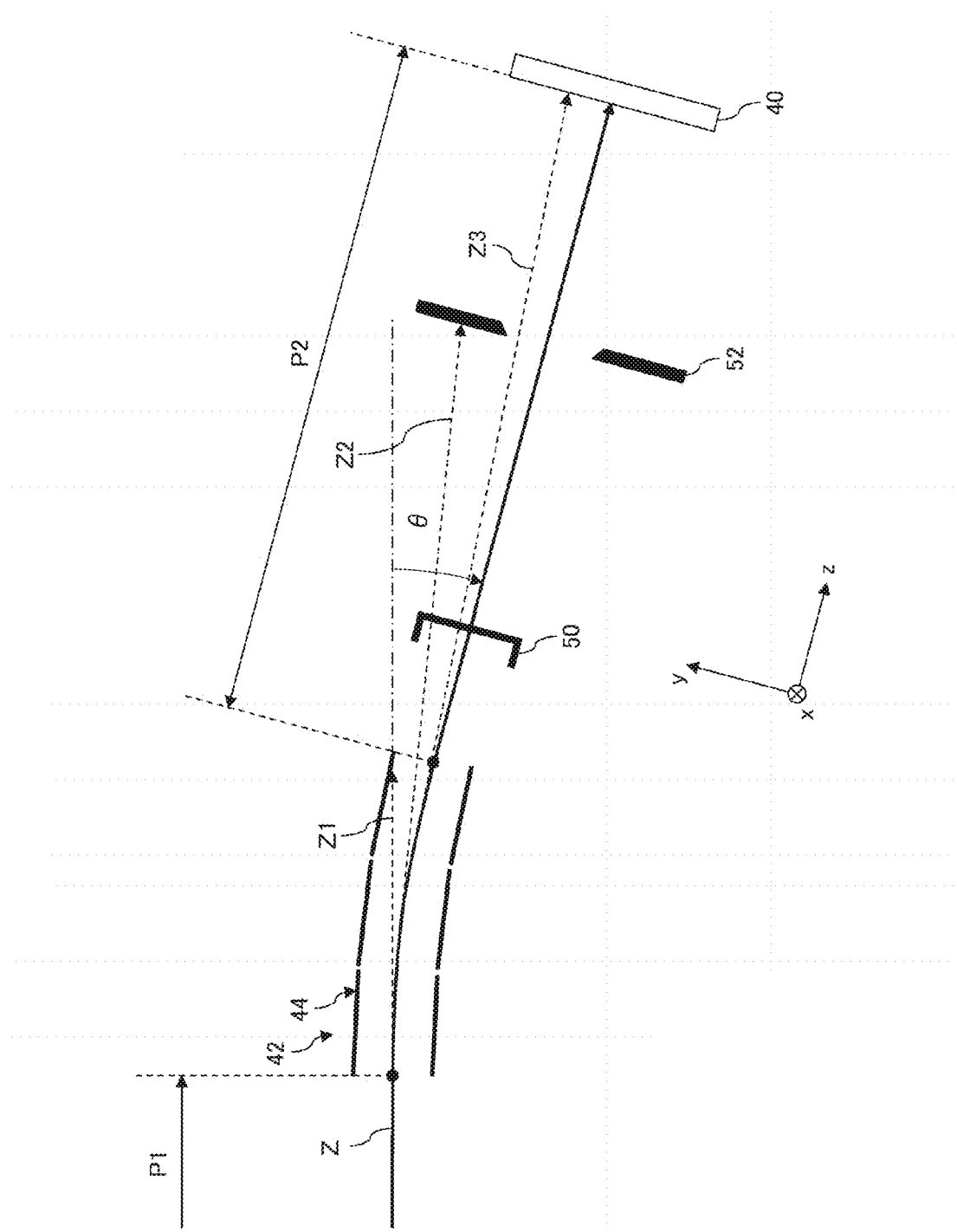
FIG. 4 is a diagram schematically illustrating a trajectory that a beam capable of being incident to a dose cup has in an ion implanter according to a comparative example.

FIG. 4 is a diagram schematically illustrating a trajectory that a beam capable of being incident to a dose cup 50 has in an ion implanter according to a comparative example. This drawing schematically illustrates the arrangement relationship of the beam deflector 42, the dose cup 50, the beam filter slit 52, and the wafer 40 illustrated in FIG. 3B, but the comparative example differs from the embodiment in that the trajectory limiting mechanism 60 is not provided. In this drawing, "reference trajectory Z" through which the ions having desired energy and charge state pass are indicated by thick lines. This corresponds to the beam trajectory Z illustrated in FIG. 3B. The ion beam traveling along the reference trajectory Z is incident to the beam deflector 42 through the previous stage beam path P1, is deflected by the action of the electric field by the AEF electrode device 44, and exits from the beam deflector 42 such that the ion beam passes through the subsequent stage beam path P2 directed toward the wafer 40. In addition, in this drawing, as the beam trajectory deviated from the reference trajectory Z, a first trajectory Z1, a second trajectory Z2, and a third trajectory Z3 are illustrated.

The first trajectory Z1 is the trajectory where the beam incident to the beam deflector 42 travels straight and collides with the AEF electrode device 44. For example, the first trajectory Z1 corresponds to the trajectory through which the charge state of ion changes before entering the beam deflector 42 and the ion is neutralized so that the beam traveling direction is not deflected in the beam deflector 42. Since the beam component passing through the first trajectory Z1 cannot exit from the beam deflector 42, the beam component is not incident to the wafer 40 and is not incident to the dose cup 50. Therefore, the beam component passing through the first trajectory Z1 does not influence the measurement result of the dose cup 50 and does not influence the result of the implantation into the wafer.

The second trajectory Z2 is the trajectory where the deflection angle by the beam deflector 42 is smaller than the reference trajectory Z and the trajectory where the beam component that exits from the beam deflector 42 but is shielded by the beam filter slit 52 passes. For example, the second trajectory Z2 corresponds to the trajectory deviated from the reference trajectory Z in the middle of the beam deflector 42 because the charge state of ion changes while passing through the beam deflector 42. Since the beam component passing through the second trajectory Z2 is shielded at the beam filter slit 52, the beam component is not incident to the wafer 40. However, the beam component is incident to the dose cup 50 so as to exit from the beam deflector 42. Therefore, if the beam component passing through the second trajectory Z2 is measured by the dose cup 50, a difference may occur in the calculation of the beam irradiation amount incident to the wafer 40.

The third trajectory Z3 is the trajectory where the deflection angle by the beam deflector 42 is smaller than the reference trajectory Z but the beam component capable of being incident to the wafer 40 passes without being shielded by the beam filter slit 52. For example, the third trajectory Z3 corresponds to the trajectory slightly deviated from the reference trajectory Z because the charge state of ion changes in the vicinity of the exit of the beam deflector 42 while passing through the beam deflector 42. Since the beam component passing through the third trajectory Z3 is not shielded at the beam filter slit 52, the beam component can be incident to the wafer 40. In addition, the beam component can be incident to the dose cup 50. Therefore, the beam component passing through the third trajectory Z3 is the beam component having the above-described predetermined trajectory and the beam component that must be measured at the dose cup 50.

The plurality of beam trajectories illustrated in FIG. 4 intends to indicate the beam trajectory in the yz plane when the extending direction of the subsequent stage beam path P2 is the z direction and the deflection direction of the beam by the beam deflector 42 is the y direction. That is, it is intended to note what value is the y-direction angle formed by the beam traveling direction and the z direction at each position in the yz plane, and it is not intended to note the x-direction position of the beam trajectory due to the beam scan. The beam incident to the wafer and the beam incident to the dose cup pass through different trajectories in the x direction. However, as illustrated in FIG. 4, the beam trajectory in the yz plane when viewed in the x-axis direction is the same as the beam incident to the wafer and the beam incident to the dose cup. For example, the beam having the reference trajectory Z is the concept including both of the beam directed toward the valid implantation region R2 in accordance with the scanning amount of the beam scan and the beam directed toward the end region R3. Therefore, among the beam components having the reference trajectory Z, a part of the beam components directed toward the valid implantation region R2 is incident to the wafer 40, and a part of the beam components directed toward the end region R3 is incident to the dose cup 50. In addition, among the beam components having the second trajectory Z2, a part of the beam components directed toward the valid implantation region R2 is shielded at the beam filter slit 52, and a part of the beam components directed toward the end region R3 is incident to the dose cup 50.

Figure 5:
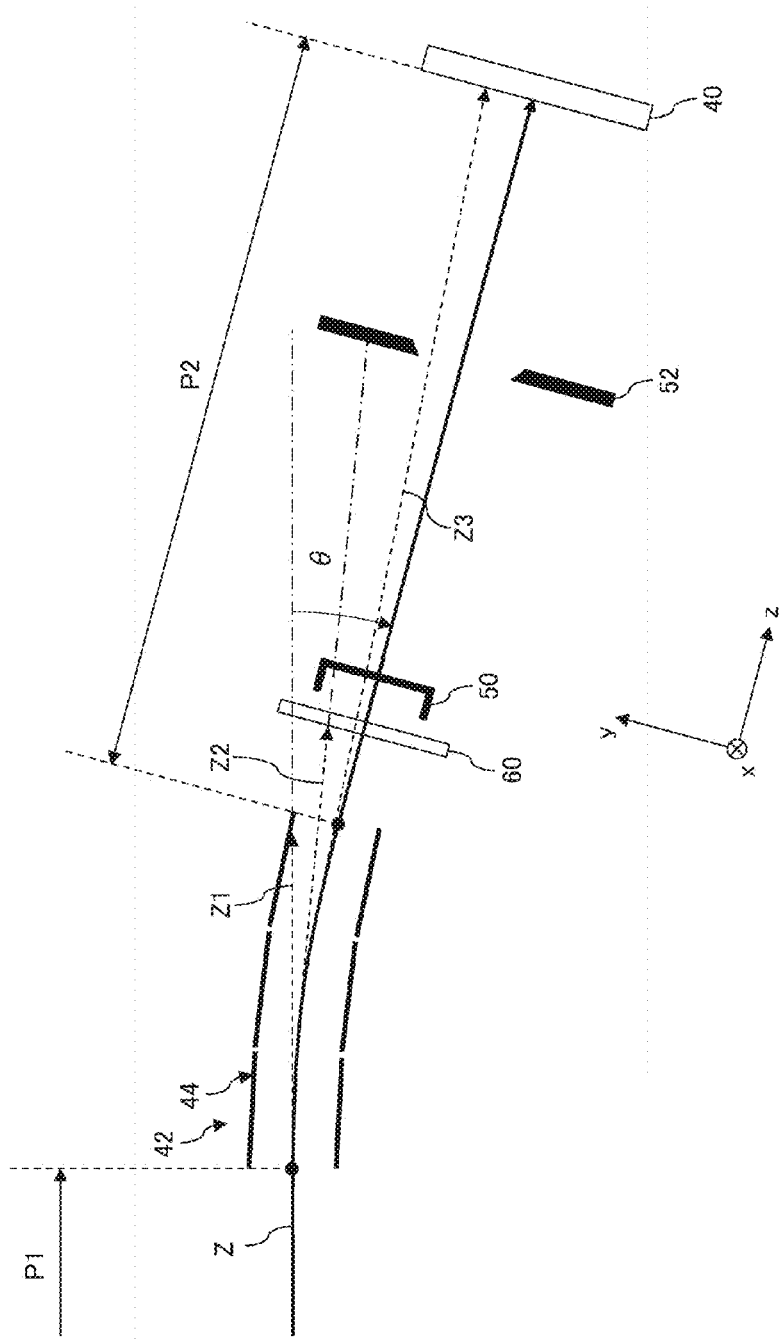
FIG. 5 is a diagram schematically illustrating a trajectory that a beam capable of being incident to a dose cup has in an ion implanter according to the present embodiment.

FIG. 5 is a diagram schematically illustrating the trajectory that the beam capable of being incident to the dose cup has in the ion implanter 100 according to the present embodiment. This drawing illustrates an aspect in which the beam component having the second trajectory Z2 is limited by the trajectory limiting mechanism 60 and is not incident to the dose cup 50. In a comparative example illustrated in FIG. 4, when the dose cup 50 is disposed in front of the beam filter slit 52, the beam component is generated which has the trajectory (for example, the second trajectory Z2) that is shielded at the beam filter slit 52 and is not incident to the wafer 40 but becomes the measurement target of the dose cup 50. On the other hand, in the present embodiment, the trajectory limiting mechanism 60 is disposed at the entrance of the dose cup 50 to prevent the beam component having the trajectory such as the second trajectory Z2 from being incident to the measurement region of the dose cup 50. In this way, even when the dose cup 50 is disposed in front of the beam filter slit 52, only the beam component having the trajectory capable of being incident to the wafer 40 by passing through the beam filter slit 52 can become the measurement target of the dose cup 50.

Figure 6:
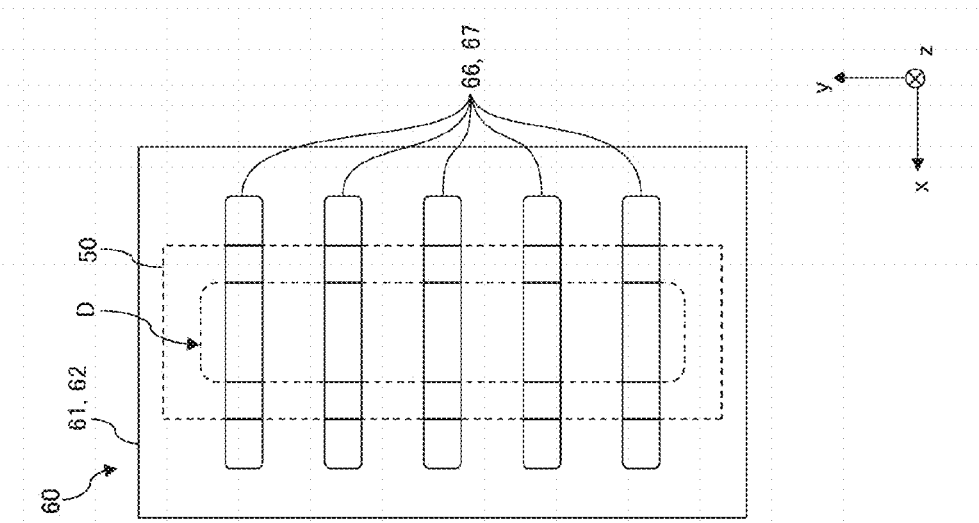
FIG. 6A is a cross-sectional view schematically illustrating a configuration of a trajectory limiting mechanism.
FIG. 6B is a front view schematically illustrating the configuration of the trajectory limiting mechanism.

FIG. 6A is a cross-sectional view schematically illustrating the configuration of the trajectory limiting mechanism 60, and FIG. 6B is a front view schematically illustrating the configuration of the trajectory limiting mechanism 60. The trajectory limiting mechanism 60 includes a first mask member 61 having a plurality of first openings 66 and a second mask member 62 having a plurality of second openings 67. The first mask member 61 and the second mask member 62 are disposed to face each other in the z direction in which the subsequent stage beam path extends. The first mask member 61 and the second mask member 62 are made of a metal material such as stainless steel or graphite (C). It is desirable that graphite is used so as to reduce the influence of wafer contamination.

The first openings 66 have a slit shape that is elongated in the x direction and are disposed in alignment with the y direction at positions opposite to the measurement region D of the dose cup 50. Similarly, the second openings 67 have a slit shape that is elongated in the x direction and are disposed in alignment with the y direction at positions opposite to the measurement region D of the dose cup 50. The first openings 66 and the second openings 67 are not limited to the elongated slit shape, and may have other shapes, such as a circular aperture, as long as the openings can regulate the opening width in the y direction. In this drawing, the x direction is the beam scan direction, and the y direction is the direction perpendicular to both the x direction and the z direction in which the subsequent stage beam path P2 extends.

For example, the plurality of first openings 66 is disposed at the same opening width w1 and the same interval d1, and similarly, the plurality of second openings 67 is disposed at the same opening width w2 and the same interval d2. In addition, each of the plurality of second openings 67 is disposed to face each of the plurality of first openings 66. In the present embodiment, a case where five first openings 66 and five second openings 67 are provided is illustrated, but the number of the first openings 66 and the number of the second openings 67 are not limited thereto and different number of openings may be provided.

The trajectory limiting mechanism 60 allows the beam component having the trajectory capable of passing through both the first openings 66 and the second openings 67, to be incident to the dose cup 50, but prevents the beam component, which cannot pass through either of the first openings 66 and the second openings 67, from being incident to the dose cup 50. The trajectory limiting mechanism 60 prevents the passage of the beam components other than the predetermined trajectory by passing the beam component having the above-described predetermined trajectory capable of being incident to the wafer 40 after exiting from the beam deflector 42. The trajectory limiting mechanism 60 is configured to allow passage of the beam component having, for example, the reference trajectory Z and the third trajectory Z3 described above but prevent the beam component having the second trajectory Z2 from passing. The trajectory limited by the trajectory limiting mechanism 60 is adjusted by the distance L at which the first mask member 61 and the second mask member 62 face each other, the opening widths w1 and w2 or the intervals d1 and d2 of the first openings 66 and the second openings 67, the y-direction relative positions of the first openings 66 and the second openings 67 facing each other, or the like.

Figure 7:
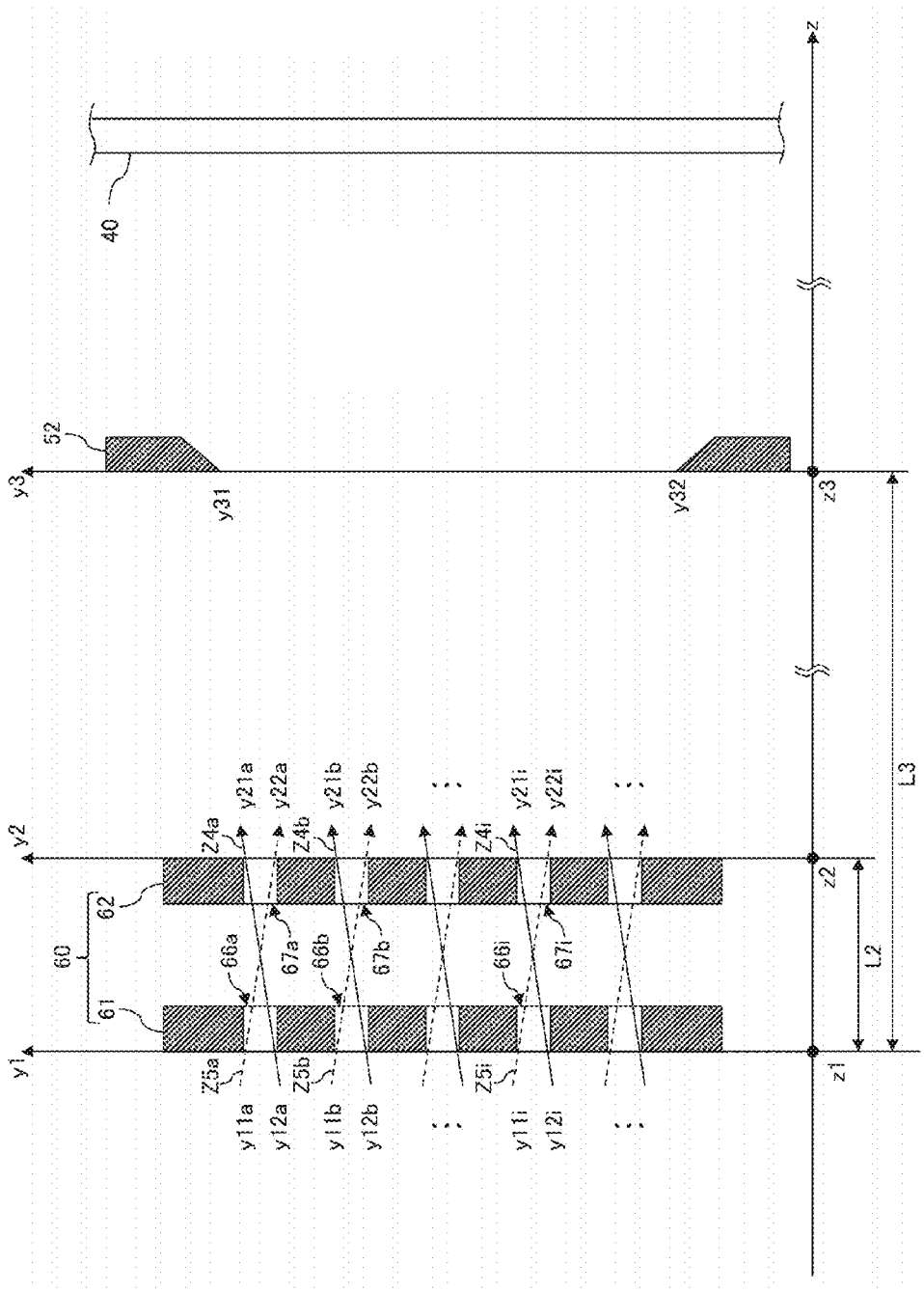
FIG. 7 is a diagram schematically illustrating a beam trajectory capable of passing through the trajectory limiting mechanism.

FIG. 7 is a diagram schematically illustrating the beam trajectory capable of passing through the trajectory limiting mechanism 60 and is a diagram illustrating the arrangement relationship of the first mask member 61, the second mask member 62, and the beam filter slit 52 on the subsequent stage beam path. The first mask member 61, the second mask member 62, and the beam filter slit 52 are disposed such that the z-direction positions thereof become z1, z2, and z3, respectively. The z-direction distance between the first mask member 61 and the second mask member 62 is L2, and the z-direction distance between the first mask member 61 and the beam filter slit 52 is L3. In addition, the y-direction coordinates of the first openings 66a, 66b, ..., 66i, ... are defined on the y1 axis at the position of z=z1 where the first mask member 61 is disposed. Similarly, the y-direction coordinates of the second openings 67a, 67b, ..., 67i, ... are defined on the y2 axis at the position of z=z2 where the second mask member 62 is disposed. The coordinates of the upper end position y31 and the lower end position y32 of the slit are defined on the y3 axis at the position of z=z3 where the beam filter slit 52 is disposed.

In this drawing, the limit of the beam trajectory passing through both the first opening and the second opening corresponding to each other is schematically illustrated. For example, as the beam trajectory capable of passing through both of the first opening 66a and the second opening 67a disposed at the upper end, the upper-limit beam trajectory Z4a and the lower-limit beam trajectory Z5a are illustrated. The upper-limit beam trajectory Z4a indicated by a solid line is a beam trajectory that is directed from a lower end position y12a of the first opening 66a toward an upper end position y21a of the second opening 67a and is a trajectory that is deviated from the z-direction reference trajectory in the +y direction but is capable of barely passing through the trajectory limiting mechanism 60. Here, the upper-limit beam trajectory Z4a may pass between an upper end position y31 and a lower end position y32 of the beam filter slit 52, so that the beam component having the trajectory capable of passing through the beam filter slit 52 can pass through the trajectory limiting mechanism 60. Such a condition can be expressed as Formula (1) below.

$$y31 < y12a + (y21a - y12a)/L2 \times L3 < y32 \tag{1}$$

Similarly, the lower-limit beam trajectory Z5a indicated by a dashed line is a beam trajectory that is directed from an upper end position y11a of the first opening 66a toward a lower end position y22a of the second opening 67a and is a trajectory that is deviated from the z-direction reference trajectory in the −y direction but is capable of barely passing through the trajectory limiting mechanism 60. The condition for allowing the lower-limit beam trajectory Z5a to pass through the beam filter slit 52 can be expressed as Formula (2) below.

$$y31 < y11a + (y22a - y11a)/L2 \times L3 < y32 \tag{2}$$

When Formulas (1) and (2) are generalized and applied to an upper-limit beam trajectory Z4i and a lower-limit beam trajectory Z5i capable of passing through an i-th first opening 66i and an i-th second opening 67i, the condition is expressed as Formulas (3) and (4) below.

$$y31 < y12i + (y21i - y12i)/L2 \times L3 < y32 \tag{3}$$

$$y31 < y11i + (y22i - y11i)/L2 \times L3 < y32 \tag{4}$$

Therefore, in order to satisfy the above condition, the trajectory limiting mechanism 60 may define the distance L2 at which the first mask member 61 and the second mask member 62 face each other, the opening widths or the intervals of the first openings 66 and the second openings 67, the y-direction relative positions of the first openings 66 and the second openings 67 facing each other, or the like. Accordingly, among the beam components that are directed toward the dose cup 50, the beam component having a trajectory deviated from a predetermined trajectory can be prevented from entering the measurement region D of the dose cup 50.

On the other hand, when the trajectory limiting mechanism 60 is provided at the entrance of the dose cup 50, the beam amount incident to the dose cup 50 may be reduced and the measurement accuracy may be lowered. Thus, it is desirable to increase the opening ratios of the openings of the first mask member 61 and the second mask member 62 so as to increase the beam amount incident to the dose cup 50. Here, the opening ratios refer to the opening ratios of the first mask member 61 and the second mask member 62 in the region (hereinbelow referred to as the mask region) facing the measurement region D of the dose cup 50 illustrated in FIG. 6B. Since the first opening 66 and the second opening 67 according to the present embodiment have a slit shape that is elongated in the x direction, the opening ratio of the trajectory limiting mechanism 60 is determined according to the ratios of the y-direction opening widths w1 and w2 and the intervals d1 and d2 of the first opening 66 and the second opening 67 illustrated in FIG. 6B. For example, the opening ratio in the mask region of the first mask member 61 illustrated in FIG. 6B is w1/(w1+d1), and the opening ratio in the mask region of the second mask member 62 is w2/(w2+d2).

It is desirable that the opening ratios of the first mask member 61 and the second mask member 62 are as large as possible. However, if the opening ratio is excessively large, the beam trajectory cannot be appropriately limited, or the structural strength of the first mask member 61 and the second mask member 62 may be lowered. In a case where graphite is used as the material of the first mask member 61 and the second mask member 62, it is desirable that the opening ratios have a value of 1/3 to 2/3, considering the structural strength or processing easiness of the graphite. By setting these opening ratios, it is possible to limit the beam component having the trajectory other than the predetermined trajectory and ensure the beam amount incident to the dose cup 50.

Figure 8:
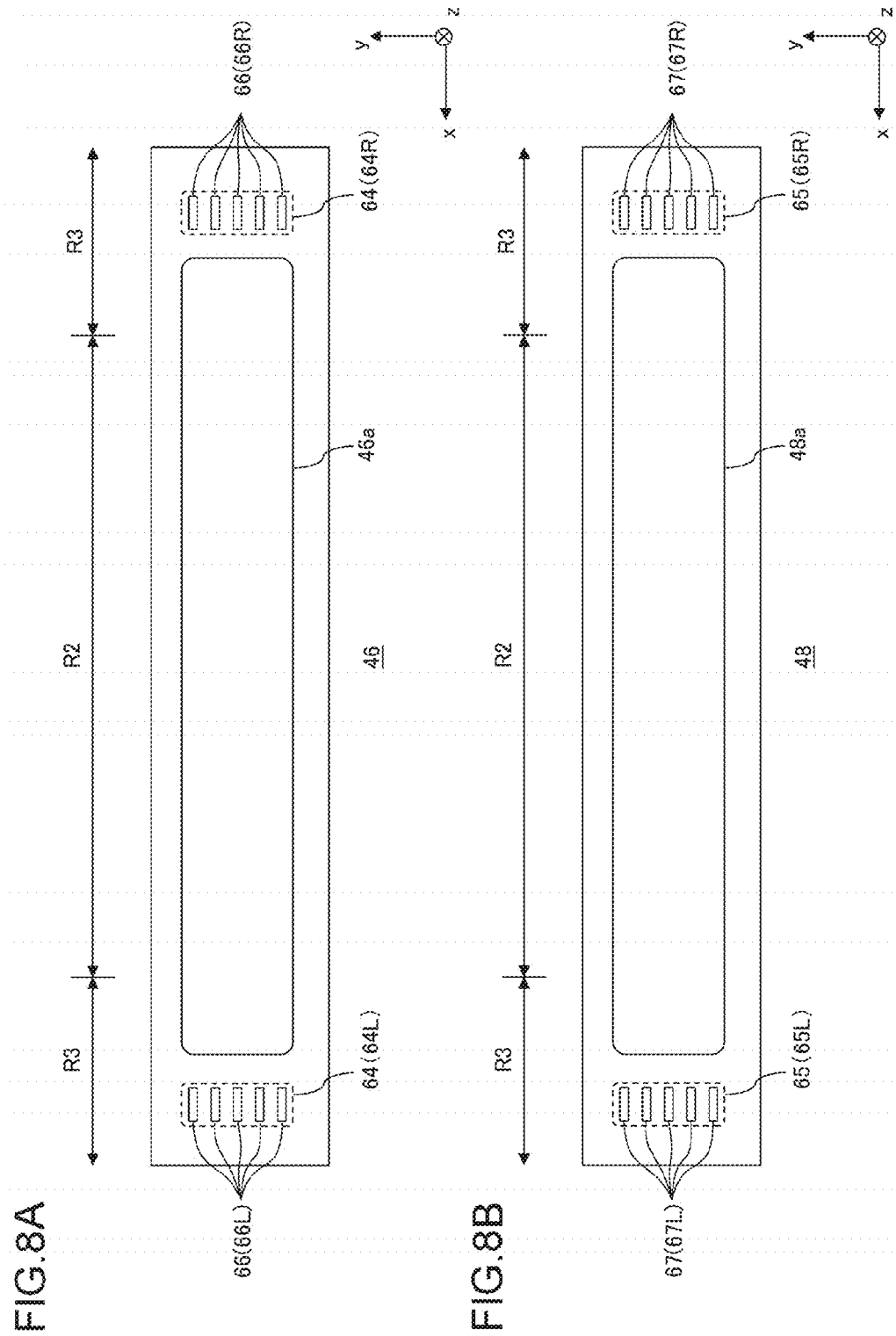
FIG. 8A is a front view illustrating a first opening formed in an upstream ground electrode.
FIG. 8B is a front view illustrating a second opening formed in a downstream ground electrode.

Then, an example in which the trajectory limiting mechanism 60 is integrated with the suppression electrode device 49 is described. FIG. 8A is a front view illustrating the first opening 66 formed in the upstream ground electrode 46, and FIG. 8B is a front view illustrating the second opening 67 formed in the downstream ground electrode 48. This drawing is a plan view when viewing the upstream ground electrode 46 or the downstream ground electrode 48 in the beam traveling direction (z direction) from the upstream side where the beam deflector 42 is disposed.

As illustrated in FIG. 8A, the upstream ground electrode 46 includes an electrode opening 46a for passing the beam directed toward the valid implantation region R2, and a plurality of first openings 66 (66L, 66R) disposed on the left and right sides of the electrode opening 46a. The plurality of first openings 66L and 66R is disposed in the first mask regions 64 (64L, 64R) located in the left and right end regions R3 of the electrode opening 46a. The first left mask region 64L where the first opening 66L of the left side is disposed corresponds to the measurement region of the left dose cup 50L, and the first right mask region 64R where the first opening 66R of the right side is disposed corresponds to the measurement region of the right dose cup 50R. In this way, by forming the first opening 66 in the upstream ground electrode 46, the upstream ground electrode 46 can have the same function as the first mask member 61 described above.

The same applies to the downstream ground electrode 48 illustrated in FIG. 8B. The downstream ground electrode 48 includes an electrode opening 48a for passing the beam mainly directed toward the valid implantation region R2, and a plurality of second openings 67 (67L, 67R) disposed on the left and right sides of the electrode opening 48a. The plurality of second openings 67L and 67R is disposed in the second mask regions 65 (65L, 65R) located in the left and right end regions R3 of the electrode opening 48a. The second left mask region 65L where the second opening 67L of the left side is disposed corresponds to the measurement region of the left dose cup 50L, and the second right mask region 65R where the second opening 67R of the right side is disposed corresponds to the measurement region of the right dose cup 50R. In this way, by forming the second opening 67 in the downstream ground electrode 48, the downstream ground electrode 48 can have the same function as the second mask member 62 described above.

In the suppression electrode 47 disposed between the upstream ground electrode 46 and the downstream ground electrode 48, electrode openings are provided to be wider in at least the y direction than the electrode openings 46a and 48a of the upstream ground electrode 46 and the downstream ground electrode 48 and to be wider in the x direction than both end positions of the x direction of the first mask region 64 and the second mask region 65. Therefore, the beam component passing through the first opening 66 of the upstream ground electrode 46 is directed toward the second opening 67 of the downstream ground electrode 48 through the electrode opening of the suppression electrode 47.

Subsequently, the advantageous effects of the ion implanter 100 according to the present embodiment will be described.

According to the ion implanter 100, since the beam irradiation amount being implanted is measured by using the dose cup 50 disposed away from the wafer 40, it is possible to reduce the influence of the resist outgas generated in the wafer 40. In addition, by providing the trajectory limiting mechanism 60 in front of the dose cup 50, the beam component having the trajectory that is shielded at the beam filter slit 52 and is not incident to the wafer 40 can be excluded from the measurement target. Therefore, only the beam component having the predetermined trajectory capable of being incident to the wafer 40 can become the measurement target, and the beam irradiation amount incident to the wafer can be accurately estimated. In addition, since the opening ratio of the mask member constituting the trajectory limiting mechanism 60 is large, it is possible to suppress the reduction in the beam amount incident to the dose cup 50. Therefore, it is possible to accurately estimate the beam irradiation amount incident to the wafer.

In addition, according to the ion implanter 100, since the pressure compensation is performed on the beam current value measured by the dose cup 50, it is possible to more accurately estimate the beam irradiation amount incident to the wafer. The trajectory limiting mechanism 60 prevents the influence of changing the beam trajectory by the change in the charge state due to the resist outgas and measuring the beam component of the trajectory that is not incident to the wafer 40, and the pressure compensation process prevents the influence of deviation in the correspondence relationship between the implantation amount and the current value due to the change in the charge state of ion when the beam of the trajectory incident to the wafer 40 is measured. That is, the pressure compensation process aims at different phenomenon from the influence to be prevented by the trajectory limiting mechanism 60. Therefore, the accuracy of the estimation of the beam irradiation amount can be further increased by a combination of the trajectory limiting mechanism 60 and the pressure compensation process.

According to the ion implanter 100, in particular, when the wafer 40 is irradiated with the ion beam composed of multivalent ions, the accuracy of the estimation of the beam irradiation amount can be increased. For example, in a case where the ion beam composed of monovalent ions is used, monovalent ions are changed to neutral particles or divalent ions when the charge state is changed. Thus, a difference in the deflection angle by the beam deflector 42 due to the change of the charge state is large. Therefore, the beam trajectory is greatly changed due to the charge state change, and the beam component that cannot exit from the beam deflector 42 is increased by the collision with the AEF electrode device 44 of the beam deflector 42, or the like. On the other hand, in a case where the charge state is changed in multivalent ions such as trivalent or tetravalent ions and the charge state is decreased to divalent or trivalent ions or is increased to tetravalent or pentavalent ions, a difference of the deflection angle due to the charge state change is relatively small. Therefore, since the beam trajectory is not greatly changed due to the charge state change, the beam component that exits from the beam deflector 42 and then is shielded by the beam filter slit 52 is increased. Since the trajectory limiting mechanism 60 serves to block the beam component having such a trajectory, it can be said that it is particularly effective when the ion beam composed of the multivalent ions is used.

Hereinafter, modified examples of the trajectory limiting mechanism 60 according to the above-described embodiment will be described.

MODIFIED EXAMPLE 1

Figure 9:
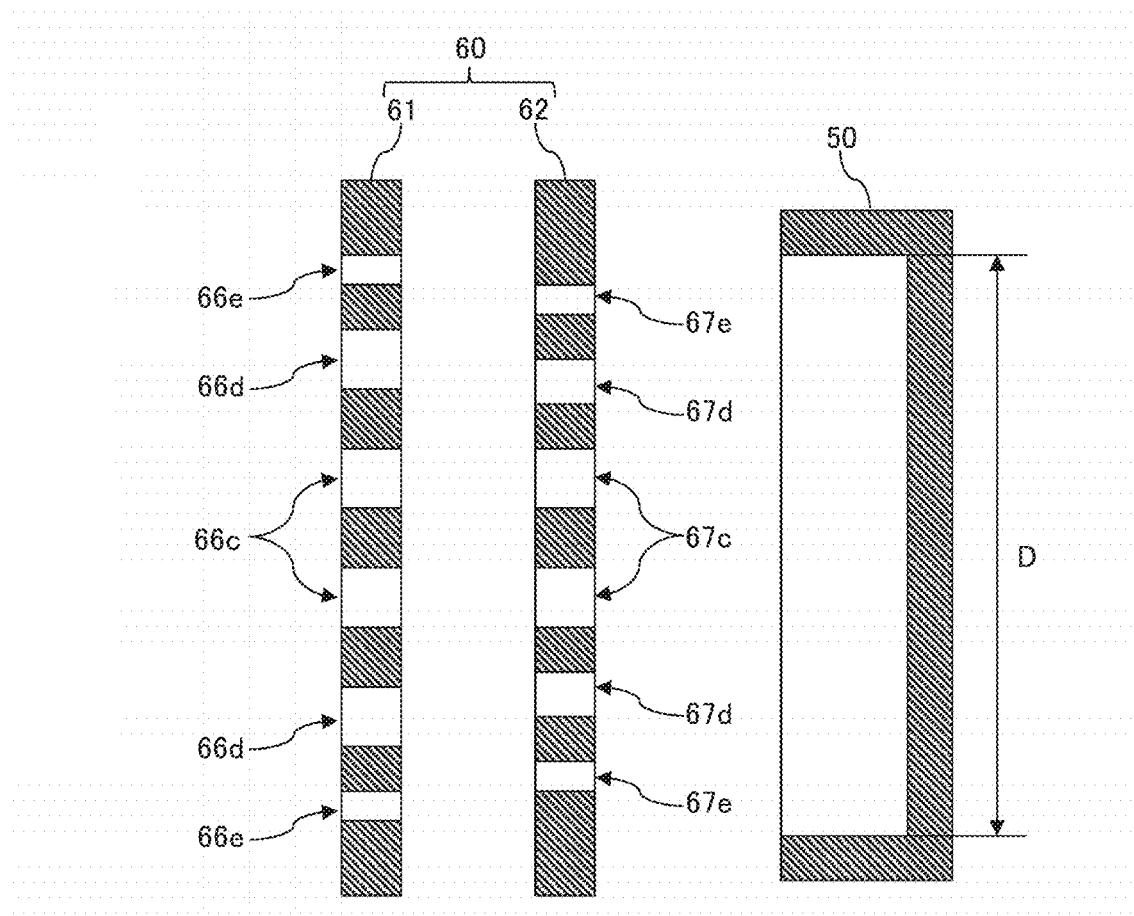
FIG. 9 is a cross-sectional view schematically illustrating a configuration of a trajectory limiting mechanism according to a modified example 1.

FIG. 9 is a cross-sectional view schematically illustrating a configuration of a trajectory limiting mechanism 60 according to a modified example 1. In the above-described embodiment, there is provided a case where the plurality of openings are uniformly disposed in the mask member at the opening width w and the interval d. In the present modified example, in the first mask member 61 and the second mask member 62, the opening width and the interval of the openings are not uniform. In addition, among the plurality of openings, a first end opening 66e and a second end opening 67e disposed at positions away from the center in the y direction are disposed at positions mutually deviated in the y direction.

FIG. 10A is a front view schematically illustrating the configuration of the first mask member 61 according to the modified example 1. The first mask member 61 according to the present modified example includes a first center opening 66c disposed around the y-direction center, a first end opening 66e disposed at a position away from the center in the y direction, and a first intermediate opening 66d disposed at a position between the first center opening 66c and the first end opening 66e.

The y-direction opening width w1e of the first end opening 66e is smaller than the y-direction opening width w1c of the first center opening 66c. The y-direction opening width w1d of the first intermediate opening 66d has a value equal to the opening width w1c of the first center opening 66c or has a value between the opening width w1c of the first center opening 66c and the opening width w1e of the first end opening 66e (a value satisfying w1e<w1d≤w1c). In addition, the interval d1e with the first opening (first intermediate opening 66d) adjacent to the first end opening 66e is smaller than the interval d1d with the first opening (first intermediate opening 66d) adjacent to the first center opening 66c.

FIG. 10B is a front view schematically illustrating the configuration of the second mask member 62 according to the modified example 1. As in the first mask member 61, the second mask member 62 according to the present modified example includes a second center opening 67c disposed around the y-direction center, a second end opening 67e disposed at a position away from the center in the y direction, and a second intermediate opening 67d disposed at a position between the second center opening 67c and the second end opening 67e The y-direction opening width w2e of the second end opening 67e is smaller than the y-direction opening width w2c of the second center opening 67c. The y-direction opening width w2d of the second intermediate opening 67d has a value equal to the opening width w2e of the second end opening 67e or has a value between the opening width w2c of the second center opening 67c and the opening width w2e of the second end opening 67e (a value satisfying w2e≤w2d<w2c). In addition, the interval d2e with the second opening (second intermediate opening 67d) adjacent to the second end opening 67e is smaller than the interval d2d with the second opening (second intermediate opening 67d) adjacent to the second center opening 67c.

As illustrated in FIG. 9, the first center opening 66c and the second center opening 67c are disposed at positions facing each other and are disposed such that the y-direction positions thereof are identical to each other. On the other hand, the first end opening 66e and the second end opening 67e are disposed such that the y-direction positions thereof are deviated from each other. The second end opening 67e is disposed at a position closer to the second center opening 67c than a position facing the first end opening 66e. Similarly, the first intermediate opening 66d and the second intermediate opening 67d are disposed to be deviated in the y direction, such that the second intermediate opening 67d is disposed at a position close to the y-direction center.

The first center opening 66c and the second center opening 67c are disposed such that the opening widths w1c and w2c are equal to each other. Similarly, the first end opening 66e and the second end opening 67e are disposed such that the opening widths w1e and w2e are equal to each other. On the other hand, the first intermediate opening 66d and the second intermediate opening 67d are disposed such that the opening width w2d of the second intermediate opening 67d is smaller than the opening width w1d of the first intermediate opening 66d.

In this way, in the trajectory limiting mechanism 60 according to the modified example 1, the width and the interval of the openings disposed in each of the first mask member 61 and the second mask member 62 are not uniform. In addition, among the plurality of openings, the first end opening 66e and the second end opening 67e disposed away from the center in the y direction are disposed to be deviated from each other in the y direction.

Figure 11:
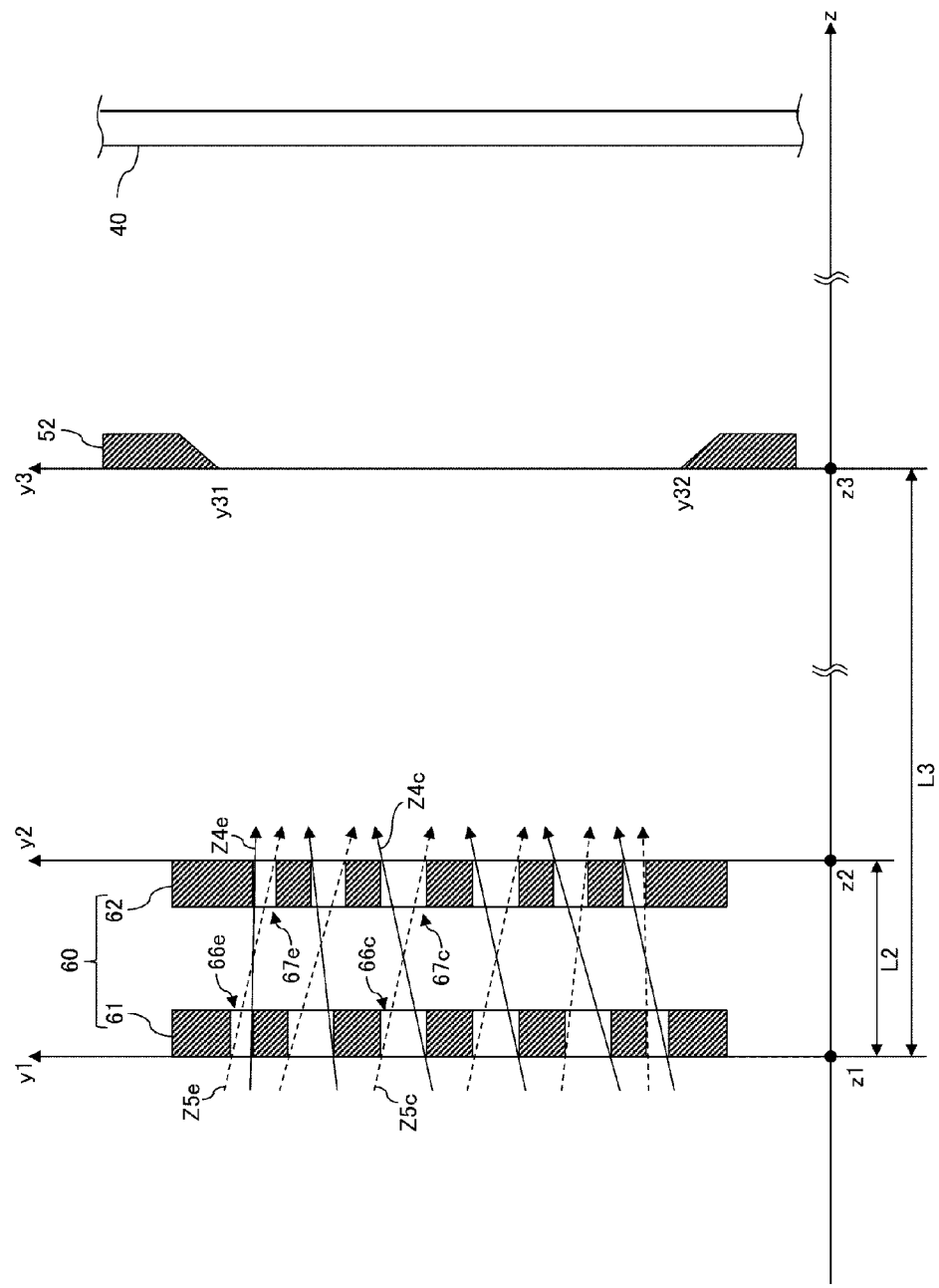
FIG. 11 is a diagram schematically illustrating a beam trajectory capable of passing through the trajectory limiting mechanism according to a modified example 1.

FIG. 11 is a diagram schematically illustrating the beam trajectory capable of passing through the trajectory limiting mechanism 60 according to the modified example 1 and is a diagram corresponding to FIG. 7 described above. First, when focusing on the trajectories Z4c and Z5c capable of passing through both the first center opening 66c and the second center opening 67c, the upper-limit beam trajectory Z4c and the lower-limit beam trajectory Z5c are symmetrical in the y direction with respect to the z-direction axis. On the other hand, when focusing on the trajectories Z4e and Z5e capable of passing through both the first end opening 66e and the second end opening 67e, the upper-limit beam trajectory Z4e and the lower-limit beam trajectory Z5e are asymmetrical in the y direction with respect to the z-direction axis. In this way, the trajectory limiting mechanism 60 according to the present modified example changes the y-direction angle range of the beam trajectory through which the beam can pass, according to which opening the beam component constituting the beam is incident to, that is, according to the y-direction incidence position of the beam component incident to the trajectory limiting mechanism 60. This is because the y-direction angle range of the beam trajectory is different as the condition that provides the beam component having the predetermined trajectory capable of passing through the beam filter slit 52 according to the y-direction incidence position of the beam component incident to the trajectory limiting mechanism 60.

Figure 12:
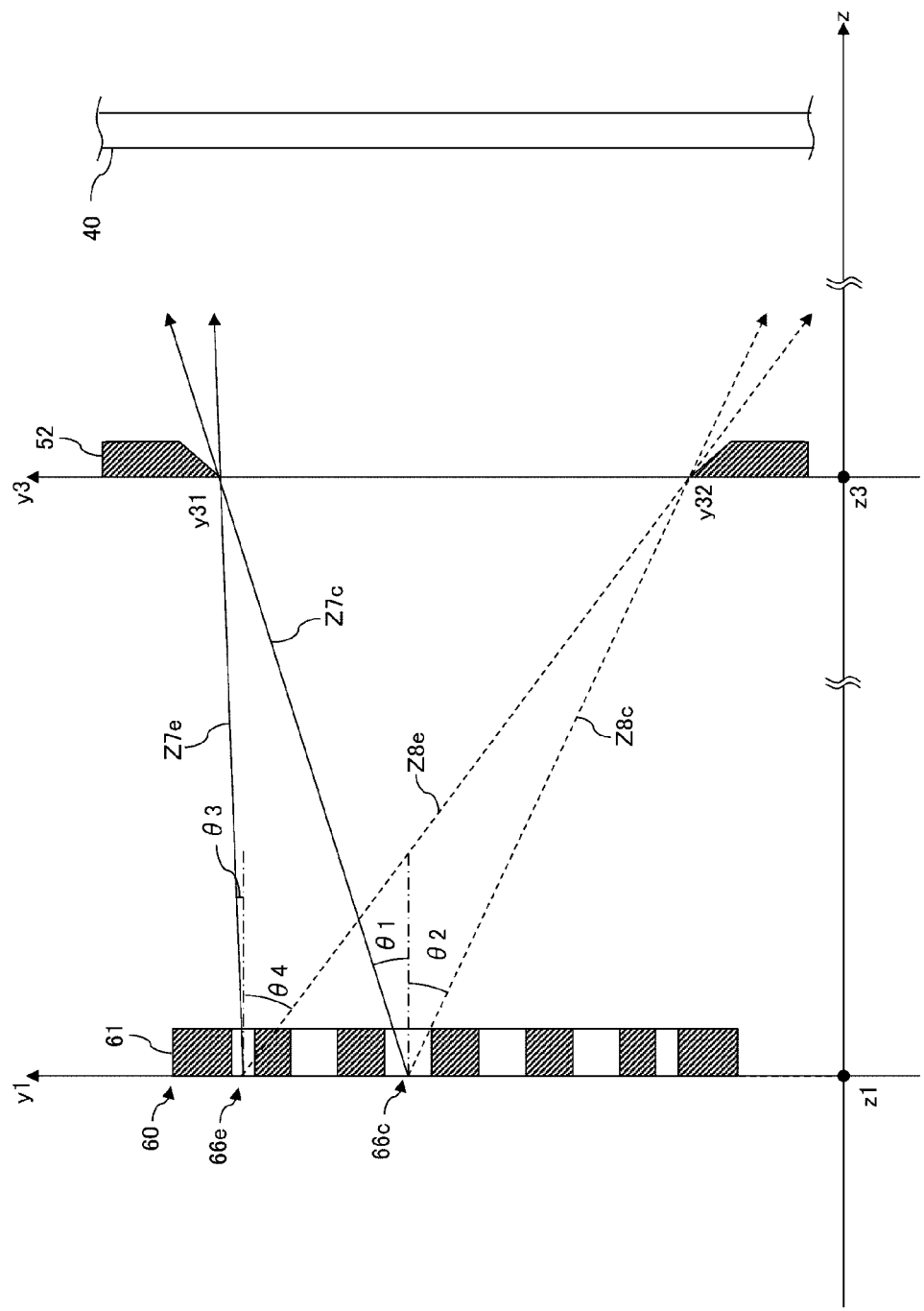
FIG. 12 is a diagram schematically illustrating a relationship between a y-direction incident position of a beam incident to the trajectory limiting mechanism and a y-direction angle range of a beam trajectory capable of passing through a beam filter slit.

FIG. 12 is a diagram schematically illustrating a relationship between the y-direction incidence position of the beam incident to the trajectory limiting mechanism 60 and the y-direction angle range of the beam trajectory capable of passing through the beam filter slit 52. This drawing illustrates the beam trajectories Z7c and Z8c capable of passing through the beam filter slit 52 after the beam is incident to the position of the first center opening 66c, and the beam trajectories Z7e and Z8e capable of passing through the beam filter slit 52 after the beam is incident to the position of the first end opening 66e.

As illustrated, the magnitude of the y-direction angle θ1 of the upper-limit beam trajectory Z7c passing through the position of the first center opening 66c is substantially equal to the magnitude of the y-direction angle θ2 of the lower-limit beam trajectory Z8c. On the other hand, the magnitude of the y-direction angle θ3 of the upper-limit beam trajectory Z7e passing through the position of the first end opening 66e is asymmetrical with the magnitude of the y-direction angle θ4 of the lower-limit beam trajectory Z8e. The beam component included in the angle range between the upper-limit beam trajectory Z7e and the lower-limit beam trajectory Z8e is mainly the beam component directed toward the center direction (−y direction). That is, the angle range of the beam trajectory that becomes the predetermined trajectory capable of passing through the beam filter slit 52 depends on the y-direction incidence position.

Since the trajectory limiting mechanism 60 according to the present modified example changes the angle range of the beam trajectory that can be passed through according to the y-direction incidence position so as to correspond to the beam trajectory illustrated in FIG. 12, only the beam component capable of passing through the beam filter slit 52 can be incident to the dose cup 50. In other words, the trajectory limiting mechanism 60 can have the same function as the beam limiting function realized by the beam filter slit 52. Therefore, even when the dose cup 50 is disposed at the more upstream side than the beam filter slit 52, the beam can be measured in the same condition as the case where the beam is measured at the downstream of the beam filter slit 52. Therefore, the beam irradiation amount during the implantation process can be accurately estimated.

MODIFIED EXAMPLE 2

FIGS. 13A and 13B are cross-sectional views schematically illustrating a configuration of a trajectory limiting mechanism 60 according to a modified example 2. In the above-described embodiment, there is provided the case where the trajectory limiting mechanism 60 is configured using two mask members. The present modified example differs from the above-described embodiment in that the trajectory limiting mechanism 60 is configured using three or more mask members.

As illustrated in FIG. 13A, the trajectory limiting mechanism 60 according to the modified example 2 further includes a third mask member 63 disposed between a first mask member 61 and a second mask member 62. In the third mask member 63, a plurality of third openings 68 is disposed. Each of the plurality of third openings 68 is disposed at a position corresponding to the first opening 66 and the second opening 67. In the present modified example, the trajectory limiting mechanism 60 allows passage of the beam component having the trajectory capable of passing through all of the first opening 66, the second opening 67, and the third opening 68 and shields the beam component having the other trajectories.

In the modified example 2, since the number of the mask members is increased, it is possible to shield the trajectory that cannot be prevented by two mask members. For example, the trajectory Z6 passing through the first opening 66 and the second opening 67b adjacent to the second opening 67a facing the first opening 66 cannot be prevented by the first mask member 61 and the second mask member 62 alone. The trajectory Z6 is generated by increasing the opening ratio of the mask member. According to the present modified example, even when the opening ratio of the trajectory limiting mechanism 60 is increased, a desired beam trajectory can be shielded by increasing the number of the mask members.

The number of the mask members may be four or more. As illustrated in FIG. 13B, a plurality of third mask members 63a and 63b may be disposed between the first mask member 61 and the second mask member 62. The third openings 68a and 68b may be disposed in the third mask members 63a and 63b, respectively.

In addition, the present modified example may be applied to the above-described modified example 1. That is, in a case where three or more mask members are provided, the corresponding openings need not be necessarily disposed at the positions facing each other, and may be disposed to be shifted in the y direction according to the beam trajectory to be limited. In addition, the opening width or the interval of the openings disposed in each of the mask members also need not be uniform, and may be non-uniformly disposed according to the beam trajectory to be limited.

MODIFIED EXAMPLE 3

FIG. 14A is a cross-sectional view schematically illustrating a configuration of a trajectory limiting mechanism 60 according to a modified example 3, and FIG. 14B is a front view schematically illustrating the configuration of the trajectory limiting mechanism 60 according to the modified example 3. The trajectory limiting mechanism 60 according to the present modified example is configured by one mask member 70 where a plurality of openings 71 is disposed. The mask member 70 is a member having a large thickness L in the z direction just like a connection of the first mask member 61 and the second mask member 62 in the above-described embodiment and is configured such that the z-direction thickness L is greater than the y-direction width w of the opening 71. As in the above-described embodiment, the trajectory limiting mechanism 60 according to the present modified example can limit the bam trajectory capable of being incident to the dose cup 50.

FIG. 14A illustrates the case where the opening 71 disposed in the mask member 70 extends in the z direction, but in the additional modified example, an opening extending in a direction inclined in the y direction with respect to the z direction may be formed. In addition, a difference may be made in an extending slope of the opening according to whether the opening is present near the center or near the end, so as to correspond to the trajectory limiting mechanism 60 according to the above-described modified example 1.

MODIFIED EXAMPLE 4

Figure 15:
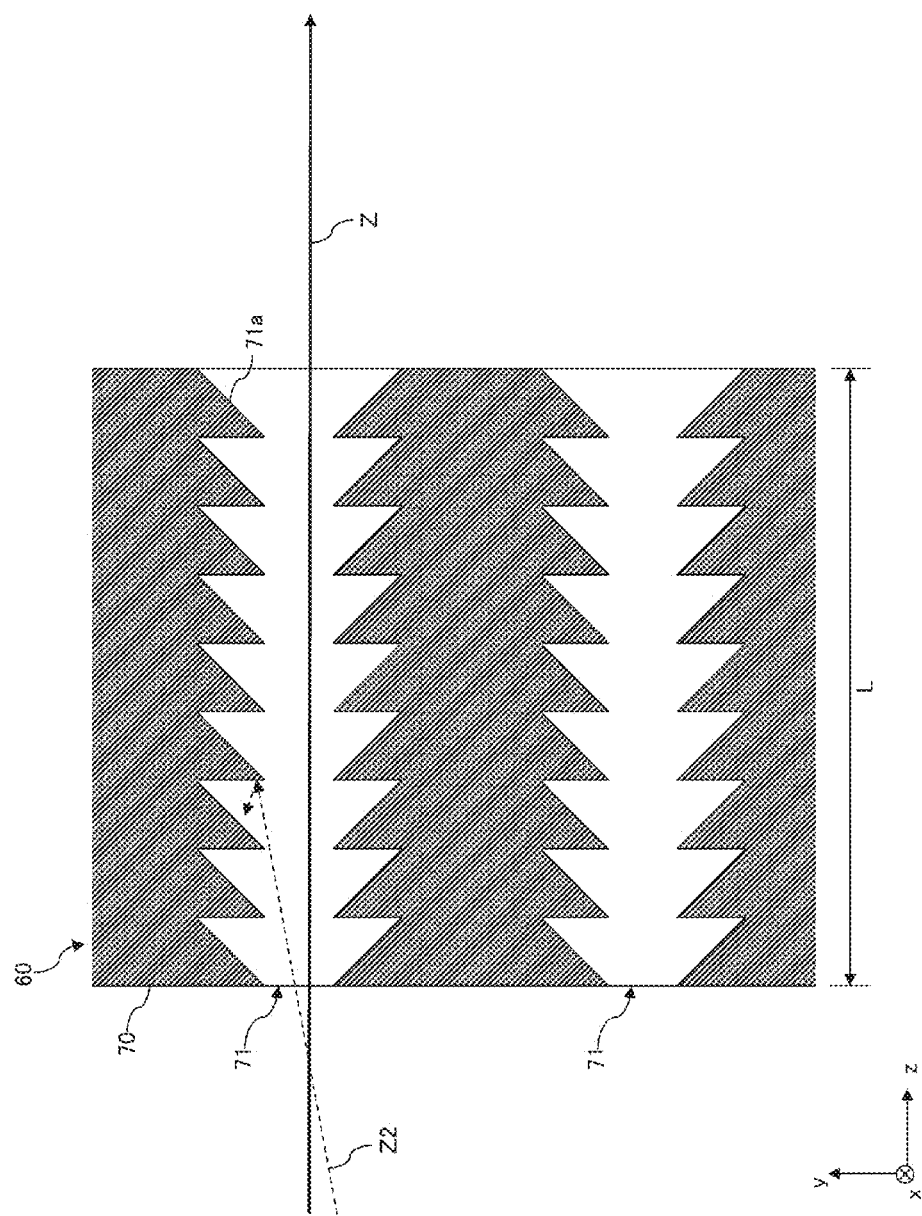
FIG. 15 is a cross-sectional view schematically illustrating a shape of an opening of a trajectory limiting mechanism according to a modified example 4.

FIG. 15 is a cross-sectional view schematically illustrating a shape of an opening 71 of a trajectory limiting mechanism 60 according to a modified example 4. As in the above-described modified example 3, the trajectory limiting mechanism 60 according to the present modified example is configured by a mask member 70, of which the z-direction thickness L is large. In addition, in the present modified example, unevenness is formed in the inner surface 71a of the opening 71, and the beam component incident to the inner surface 71a is hardly reflected toward the dose cup 50. For example, the inner surface 71a of the opening 71 is formed to have a saw blade shape. When a second trajectory Z2 deviated from a predetermined trajectory is incident to the inner surface 71a, the beam component is reflected in the −z direction opposite to the +z direction that is the original beam direction. Thus, the beam component having the trajectory that must be excluded from the measurement target of the dose cup 50 is prevented from being reflected by the inner surface 71a and reaching the dose cup 50. Therefore, the trajectory limiting function of the trajectory limiting mechanism 60 can be improved.

MODIFIED EXAMPLE 5

Figure 16:
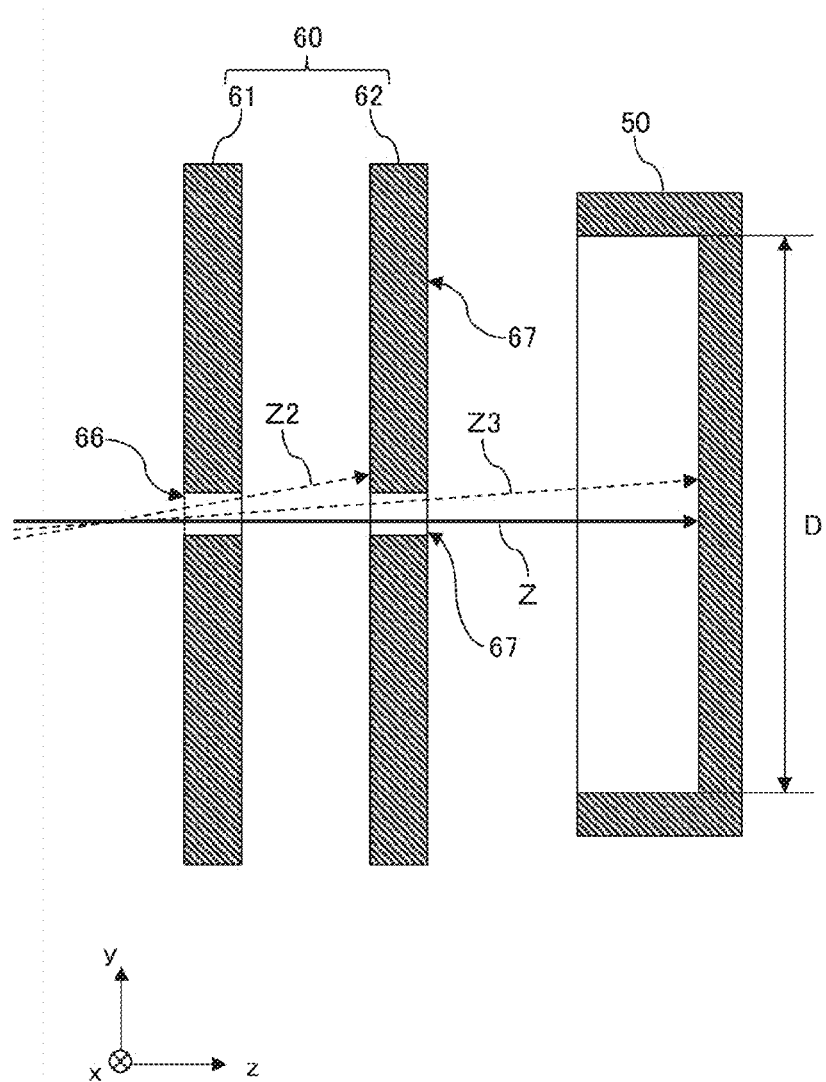
FIG. 16 is a cross-sectional view schematically illustrating a configuration of a trajectory limiting mechanism according to a modified example 5.

FIG. 16 is a cross-sectional view schematically illustrating a configuration of a trajectory limiting mechanism 60 according to a modified example 5. In the above-described embodiment, the plurality of first openings 66 and the plurality of second openings 67 are disposed in the trajectory limiting mechanism 60. The present modified example differs from the above-described embodiment in that a first mask member 61 has one first opening 66 and the second mask member 62 has one second opening 67. Even though the number of the openings is one, the beam component having the trajectories other than the predetermined trajectory can be prevented from being incident to the dose cup 50 as in the above-described trajectory limiting mechanism 60.

MODIFIED EXAMPLE 6

Figure 17B:
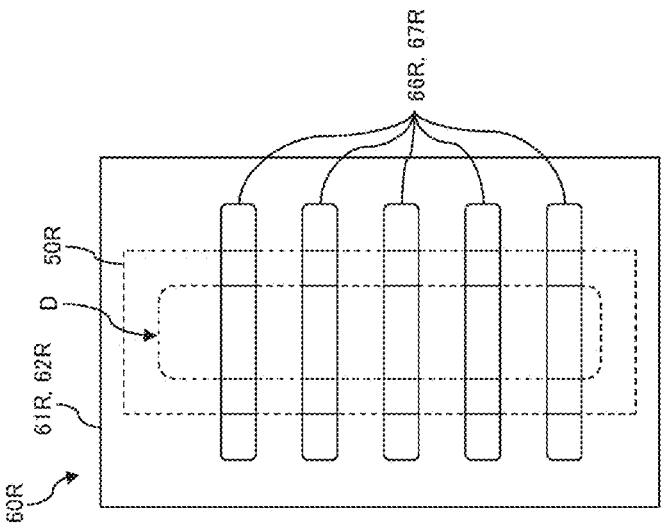
FIGS. 17A and 17B are front views schematically illustrating a configuration of a trajectory limiting mechanism according to a modified example 6.
Figure 17A:
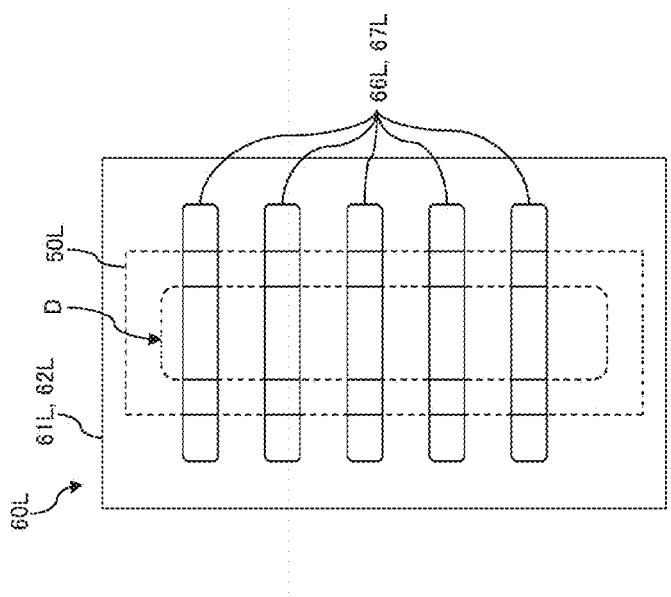

FIGS. 17A and 17B are front views schematically illustrating a configuration of a trajectory limiting mechanism according to a modified example 6. FIG. 17A illustrates a first trajectory limiting mechanism 60L disposed in a left dose cup 50L, and FIG. 17B illustrates a second trajectory limiting mechanism 60R disposed in a right dose cup 50R. In the above-described embodiment, as the trajectory limiting mechanisms 60L and 60R disposed in front of the left and right dose cups 50L and 50R, respectively, the trajectory limiting mechanism 60 in which the left and right configurations are identical to each other is provided as illustrated in FIGS. 8A and 8B. In the present modified example, the trajectory limiting mechanisms 60L and 60R in which positions where the openings are disposed are different left and right are provided. Specifically, the positions of the openings 66L and 67L disposed in the first trajectory limiting mechanism 60L and the positions of the openings 66R and 67R disposed in the second trajectory limiting mechanism 60R are disposed to be mutually deviated in the y direction. In other words, the openings 66R and 67R disposed in the second trajectory limiting mechanism 60R are disposed at the positions where the non-openings of the first trajectory limiting mechanism 60L are disposed.

In the case of using the trajectory limiting mechanism 60, the beam component directed toward the non-opening of the trajectory limiting mechanism 60 is shielded even in the case of the beam component having the above-described predetermined trajectory. Thus, in the portion where the non-opening of the trajectory limiting mechanism 60 is disposed, the beam cannot be measured. In the present modified example, among the beam components having the predetermined trajectory, the beam component having the trajectory shielded in the non-opening of the first trajectory limiting mechanism 60L is incident to the opening of the second trajectory limiting mechanism 60R. Therefore, the beam component, which is regulated by the first trajectory limiting mechanism 60L and cannot be measured by the left dose cup 50L, can be measured by the right dose cup 50R through the second trajectory limiting mechanism 60R. In other words, the beam measurement of the range that cannot be measured by one dose cup can be supplemented by the other dose cup. Therefore, the range that can be measured by the combination of the left and right dose cups can be widened and the accuracy of the estimation of the beam irradiation amount can be further increased.

As the further modified example of the modified example 6, the dose cup where the first trajectory limiting mechanism is disposed may be provided to be adjacent to the dose cup where the second trajectory limiting mechanism is disposed. For example, both of the dose cup where the first trajectory limiting mechanism is disposed and the dose cup where the second trajectory limiting mechanism is disposed may be disposed in one of the left and right end regions R3. In addition, both of the dose cup where the first trajectory limiting mechanism is disposed and the dose cup where the second trajectory limiting mechanism is disposed may be disposed in each of the left and right end regions R3. In this case, a total four trajectory limiting mechanisms and the dose cups may be disposed two by two on the left and right sides.

MODIFIED EXAMPLE 7

Figure 18:
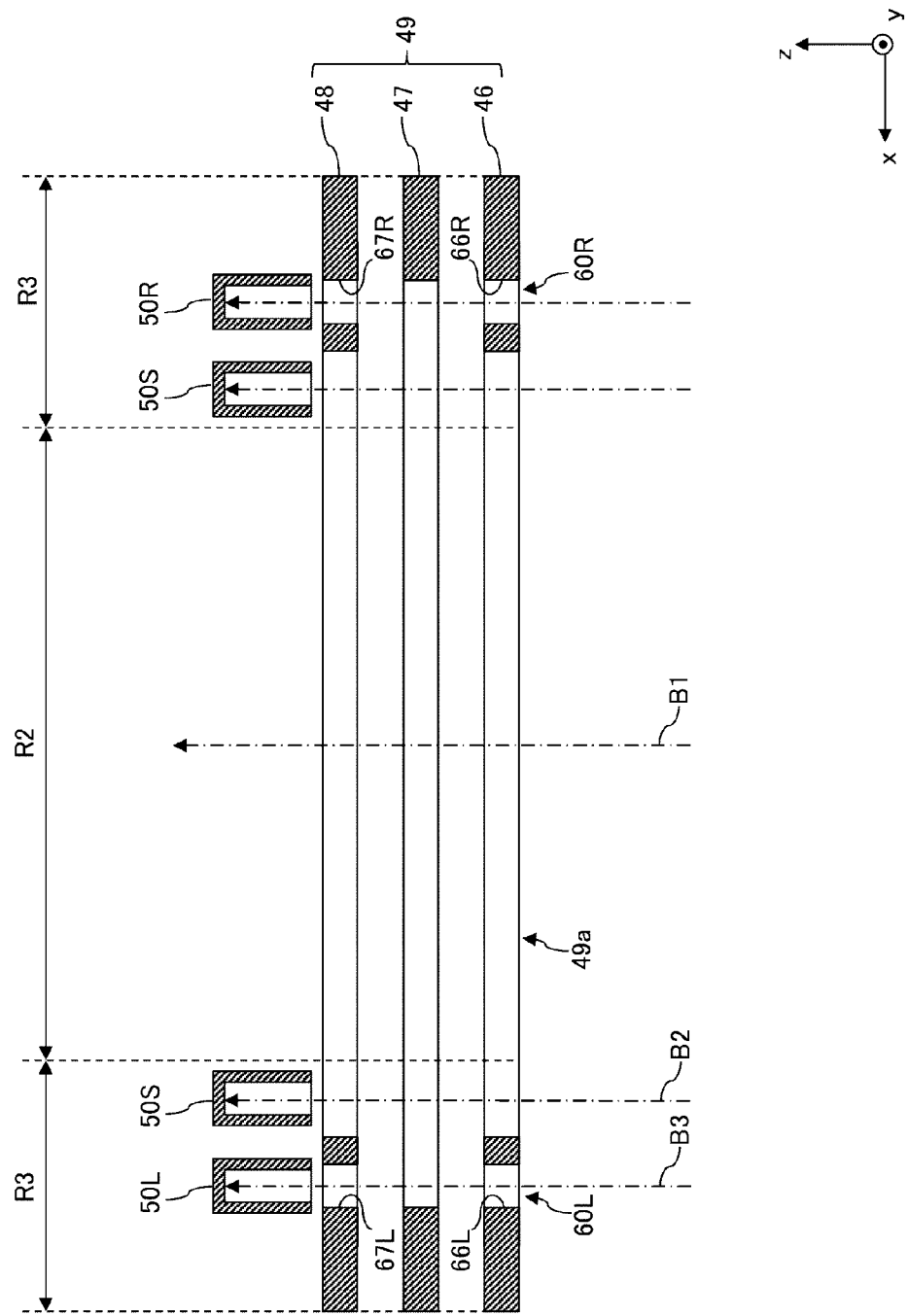
FIG. 18 is a cross-sectional view schematically illustrating a configuration of a dose cup according to a modified example 7.

FIG. 18 is a cross-sectional view schematically illustrating a configuration of a suppression electrode device 49 and dose cups 50L, 50R, and 50S according to a modified example 7. In the present modified example, in addition to the dose cups 50 (50L, 50R) where the trajectory limiting mechanisms 60 (60L, 60R) are disposed, a third dose cup 50S where the trajectory limiting mechanism 60 is not present in the entrance is further disposed.

As in the above-described dose cup 50, the third dose cup 50S is disposed at the end region R3 at the most downstream side of the final energy filter 38 and is disposed adjacent to the left dose cup 50L or the right dose cup 50R. Since the third dose cup 50S is disposed at the position where the electrode opening 49a of the suppression electrode device 49 is disposed, the trajectory of the beam B2 incident to the third dose cup 50S is not limited by the trajectory limiting mechanism 60, as in the beam B1 directed toward the valid implantation region R2. By providing the third dose cup 50S, it is possible to measure both of the beam B3 that is limited by the trajectory limiting mechanism 60 and the beam B2 that is not limited by the trajectory limiting mechanism 60.

The dose cups 50L and 50R where the trajectory limiting mechanism 60 is disposed and the third dose cup 50S where the trajectory limiting mechanism 60 is not disposed may be distinguished in use according to the ion implantation condition or the like. For example, in a case where monovalent ion beam is used, the charge state change occurs and the beam component whose trajectory is deviated hardly reaches the third dose cup 50S. Thus, the measurement result of the third dose cup 50S may be mainly used. On the other hand, in a case where multivalent ion beam is used, the charge state change occurs and the beam component whose trajectory is deviated easily reaches the third dose cup 50S. Thus, the measurement result of the dose cups 50L and 50R where the trajectory limiting mechanism 60 is disposed may be mainly used. Both the measurement results may be used for the dose control through comparison thereof.

MODIFIED EXAMPLE 8

FIGS. 19A and 19B are front views schematically illustrating a configuration of a trajectory limiting mechanism 60 according to a modified example 8. In the present modified example, the position of the trajectory limiting mechanism 60 is configured to be displaceable. The trajectory limiting mechanism 60 is displaceable between a first position that can limit a part of the beam directed toward the dose cup 50 as illustrated in FIG. 19A and a second position that does not limit the beam directed toward the dose cup 50 as illustrated in FIG. 19B. By switching the position of the trajectory limiting mechanism 60, both of the beam component that is limited by the trajectory limiting mechanism 60 and the beam component that is not limited by the trajectory limiting mechanism 60 can be measured by one dose cup 50.

While the invention has been described by referring to the above-described embodiments, the invention is not limited to the above-described embodiment, and the appropriate combination of the configurations of the embodiments or the substitution thereof is also included in the invention. Further, the combination of the embodiments or the process sequence thereof may be appropriately set or various modifications in design may be added to an embodiment based on the knowledge of the person skilled in the art. An embodiment having such modifications may be also included in the scope of the invention.

In the above-described embodiment, there is provided an example of the ion implanter 100 in which the trajectory limiting mechanism 60 is disposed in front of the dose cup 50. Another embodiment may be a beam measurement apparatus including the faraday cup and the trajectory limiting mechanism disposed in the entrance of the faraday cup. The beam measurement apparatus may be used in the ion implanter 100 and may be used for a purpose other than the ion implanter 100 so as to measure a charged particle beam such an ion beam.

The beam measurement apparatus includes the faraday cup that can measure the beam current of the ion beam, and the trajectory limiting mechanism that is disposed in the entrance of the faraday cup and prevents the beam component having the trajectory deviated from the predetermined trajectory from being incident to the measurement region of the faraday cup. The trajectory limiting mechanism may use the trajectory limiting mechanism 60 described in the above-described embodiments and modified examples. For example, the trajectory limiting mechanism includes a first mask member having one or more first openings, and a second mask member having one or more second openings. The first mask member and the second mask member are disposed to face each other in the beam traveling direction, and the beam component having the trajectory other than the trajectory capable of passing through both of the first opening and the second opening is prevented from being incident to the measurement region of the faraday cup.

In the beam measurement apparatus according to the present embodiment, since the beam component having the trajectory other than the predetermined trajectory is prevented from being incident to the faraday cup, the beam component having the predetermined trajectory can be accurately measured. For example, the beam measurement apparatus can be used as the profiler cup 57 illustrated in FIGS. 3A and 3B and can be used as the faraday cup disposed at the upstream of the beamline. In addition, the beam measurement apparatus can be widely used to measure only the beam component having a desired trajectory with respect to the charged particle beam.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
   a beam deflector that deflects an ion beam incident through a previous stage beam path in a y direction by action of either or both of an electric field and a magnetic field and emits the beam to pass through a subsequent stage beam path extending in a z direction toward a wafer;
   a beam filter slit that is disposed on the subsequent stage beam path between the beam deflector and the wafer, partially shields the beam traveling through the subsequent stage beam path toward the wafer, and allows passage of a beam component toward the wafer, the beam component having a predetermined trajectory among beam components of the beam passing through the subsequent stage beam path;
   a dose cup that is disposed between the beam deflector and the beam filter slit and measures a part of the beam exiting from the beam deflector; and
   a trajectory limiting mechanism that is disposed between the beam deflector and the dose cup and prevents a first beam component having a first trajectory deviated from the predetermined trajectory, among beam components of the beam that exits from the beam deflector and is directed toward the dose cup, from being incident to a measurement region of the dose cup,
   wherein the trajectory limiting mechanism includes a first mask member comprising one or more first openings and a second mask member comprising one or more second openings, the first mask member and the second mask member are disposed to face each other in the z direction and prevent a second beam component having a second trajectory other than a third trajectory capable of passing through both the first openings and the second openings from being incident to the measurement region of the dose cup.

2. The ion implanter according to claim 1, wherein the first openings and the second openings are respectively disposed in alignment with respect to the y direction perpendicular to the z direction in which the subsequent stage beam path extends.

3. An ion implanter comprising:
   a beam deflector that deflects an ion beam incident through a previous stage beam path in a y direction by action of either or both of an electric field and a magnetic field and emits the beam to pass through a subsequent stage beam path extending in a z direction toward a wafer;
   a beam filter slit that is disposed on the subsequent stage beam path between the beam deflector and the wafer, partially shields the beam traveling through the subsequent stage beam path toward the wafer, and allows passage of a beam component toward the wafer, the beam component having a predetermined trajectory among beam components of the beam passing through the subsequent stage beam path;

a dose cup that is disposed between the beam deflector and the beam filter slit and measures a part of the beam exiting from the beam deflector; and a trajectory limiting mechanism that is disposed between the beam deflector and the dose cup and prevents a beam component having a trajectory deviated from the predetermined trajectory, among beam components of the beam that exits from the beam deflector and is directed toward the dose cup, from being incident to a measurement region of the dose cup, wherein the trajectory limiting mechanism includes a mask member comprising one or more openings, wherein the openings are disposed in alignment with respect to the y direction perpendicular to the z direction in which the subsequent stage beam path extends, wherein the openings are formed in a mask region of the mask member facing the measurement region of the dose cup, and wherein an opening ratio of the mask region in the y direction is from 1/3 to 2/3.

4. The ion implanter according to claim 1, wherein at least one of the first and second openings has a slit shape that is elongated in an x direction perpendicular to both of the y direction and the z direction.

5. The ion implanter according to claim 1, wherein the second mask member has the second openings disposed at positions facing the first openings.

6. The ion implanter according to claim 1, wherein the first mask member has a plurality of first openings disposed in alignment with respect to the y direction, wherein the second mask member has a plurality of second openings disposed in alignment with respect to the y direction in correspondence to the plurality of first openings, and is disposed at the downstream side of the first mask member, wherein each of the plurality of first openings and the plurality of second openings has a slit shape that is elongated in an x direction perpendicular to both of the y direction and the z direction, wherein the plurality of first openings includes a first center opening disposed around a center in the y direction, and a first end opening disposed away from the first center opening in the y direction, wherein the plurality of second openings includes a second center opening disposed around a center in the y direction, and a second end opening disposed away from the second center opening in the y direction, and wherein the second center opening is disposed at a position facing the first center opening, and the second end opening is disposed closer to the second center opening than a position facing the first end opening.

7. The ion implanter according to claim 6, wherein the second mask member is configured such that an interval of the second openings adjacent to each other in the second end opening is smaller than an interval of the second openings adjacent to each other in the second center opening.

8. The ion implanter according to claim 6, wherein the second mask member is configured such that a y-direction opening width in the second end opening is smaller than a y-direction opening width in the second center opening.

9. The ion implanter according to claim 1, wherein the trajectory limiting mechanism includes one or more third mask member that is disposed between the first mask member and the second mask member and has one or more third openings, and a third beam component having a fourth trajectory other than a fifth trajectory capable of passing through all of the first openings, the second openings, and third openings is prevented from being incident to the measurement region of the dose cup.

10. The ion implanter according to claim 1, wherein the beam deflector includes at least one pair of deflection electrodes and deflects the ion beam by the action of the electric field generated between the at least one pair of deflection electrodes, wherein a y-direction deflection angle by the beam deflector of a part of ions constituting the ion beam is changed due to a change of charge before incidence to the beam deflector or while passing through the beam deflector, and a part of the ions which undergoes the deflection angle change is shielded by the beam filter slit after passing through the beam deflector, and wherein the trajectory limiting mechanism prevents a third beam component from being incident to the measurement region of the dose cup, the third beam component having a fourth trajectory deviated from the predetermined trajectory due to a change of charge before incidence to the beam deflector or while passing through the beam deflector and shielded by the beam filter slit.

11. The ion implanter according to claim 10, wherein the ion beam incident to the beam deflector includes multiply charged ions.

12. The ion implanter according to claim 1, wherein the dose cup is disposed at a position closer to a downstream side exit of the beam deflector than the beam filter slit.

13. The ion implanter according to claim 12, wherein the beam deflector includes at least one pair of deflection electrodes that deflects the ion beam by the action of the electric field generated between the at least one pair of deflection electrodes, and a suppression electrode device which is disposed at a downstream side exit of the at least one pair of deflection electrodes and includes two ground electrodes and a suppression electrode disposed between the two ground electrodes, and wherein the dose cup is disposed in the vicinity of the downstream side of the suppression electrode device.

14. An ion implanter comprising:

a beam deflector that deflects an ion beam incident through a previous stage beam path in a y direction by action of either or both of an electric field and a magnetic field and emits the beam to pass through a subsequent stage beam path extending in a z direction toward a wafer;

a beam filter slit that is disposed on the subsequent stage beam path between the beam deflector and the wafer, partially shields the beam traveling through the subsequent stage beam path toward the wafer, and allows passage of a beam component toward the wafer, the beam component having a predetermined trajectory among beam components of the beam passing through the subsequent stage beam path;

a dose cup that is disposed between the beam deflector and the beam filter slit and measures a part of the beam exiting from the beam deflector; and a trajectory limiting mechanism that is disposed between the beam deflector and the dose cup and prevents a beam component having a trajectory deviated from the predetermined trajectory, among beam components of the beam that exits from the beam deflector and is directed toward the dose cup, from being incident to a measurement region of the dose cup, wherein the beam deflector includes at least one pair of deflection electrodes that deflects the ion beam by the action of the electric field generated between the at least one pair of deflection electrodes, and a suppression electrode device which is disposed at a downstream side exit of the at least one pair of deflection electrodes and includes two ground electrodes and a suppression electrode disposed between the two ground electrodes, wherein the dose cup is disposed at a position closer to a downstream side exit of the beam deflector than the beam filter slit and disposed in the vicinity of the downstream side of the suppression electrode device, and wherein the trajectory limiting mechanism is implemented by an opening formed in at least one of the two ground electrodes.

15. The ion implanter according to claim 1, wherein the beam deflector is configured to emit a beam to an irradiation range including a valid implantation region where the wafer is disposed and an end region disposed out of the valid implantation region, and wherein the dose cup is disposed at a position to which a beam directed toward the end region is incident, so as not to block a beam directed toward the valid implantation region.

16. The ion implanter according to claim 15, further comprising: a beam scanner that is disposed at the upstream side of the beam deflector and reciprocatingly scans an ion beam in an x direction perpendicular to both of the y direction and the z direction; and a beam collimator that is disposed between the beam scanner and the deflector and collimates the reciprocatingly scanned ion beam, wherein the beam scanner is configured to reciprocatingly scan the ion beam over the irradiation range including the valid implantation region and the end region.

17. The ion implanter according to claim 1, further comprising a controller that estimates a beam irradiation amount passing through the beam filter slit and incident to the wafer per unit time by using a beam current value measured by the dose cup where the trajectory limiting mechanism is disposed.

18. The ion implanter according to claim 17, further comprising a profiler cup that measures a beam current at a position where the wafer is disposed, wherein the controller estimates the beam irradiation amount incident to the wafer per unit time by using a relationship between beam current values measured at the dose cup and the profiler cup respectively before the beam irradiation to the wafer, and a beam current value measured at the dose cup during the beam irradiation to the wafer.

19. The ion implanter according to claim 18, further comprising a reciprocating device that reciprocates the wafer in the y direction, wherein the controller adjusts a velocity of reciprocating the wafer in the y direction, based on the estimated value of the beam irradiation amount incident to the wafer per unit time, such that the beam irradiation amount incident to the wafer and an y direction irradiation amount distribution on the wafer as a total sum have a desired value and a desired y direction distribution.

20. An ion implanter comprising:

a beam deflector that deflects an ion beam incident through a previous stage beam path in a y direction by action of either or both of an electric field and a magnetic field and emits the beam to pass through a subsequent stage beam path extending in a z direction toward a wafer;

a beam filter slit that is disposed on the subsequent stage beam path between the beam deflector and the wafer, partially shields the beam traveling through the subsequent stage beam path toward the wafer, and allows passage of a beam component toward the wafer, the beam component having a predetermined trajectory among beam components of the beam passing through the subsequent stage beam path;

a dose cup that is disposed between the beam deflector and the beam filter slit and measures a part of the beam exiting from the beam deflector; and a trajectory limiting mechanism that is disposed between the beam deflector and the dose cup and prevents a beam component having a trajectory deviated from the predetermined trajectory, among beam components of the beam that exits from the beam deflector and is directed toward the dose cup, from being incident to a measurement region of the dose cup, wherein the trajectory limiting mechanism is movable between a first position at which the trajectory limiting mechanism is capable of shielding a part of the beam directed toward the dose cup and a second position at which the trajectory limiting mechanism does not shield the beam directed toward the dose cup.

21. An ion implanter comprising:

a beam deflector that deflects an ion beam incident through a previous stage beam path in a y direction by action of either or both of an electric field and a magnetic field and emits the beam to pass through a subsequent stage beam path extending in a z direction toward a wafer;

a beam filter slit that is disposed on the subsequent stage beam path between the beam deflector and the wafer, partially shields the beam traveling through the subsequent stage beam path toward the wafer, and allows passage of a beam component toward the wafer, the beam component having a predetermined trajectory among beam components of the beam passing through the subsequent stage beam path;

a first dose cup that is disposed between the beam deflector and the beam filter slit and measures a part of the beam exiting from the beam deflector; and a first trajectory limiting mechanism that is disposed between the beam deflector and the first dose cup and prevents a first beam component having a trajectory deviated from the predetermined trajectory, among beam components of the beam that exits from the beam deflector and is directed toward the dose cup, from being incident to a measurement region of the dose cup; and a second dose cup disposed between the beam deflector and the beam filter slit, wherein a second trajectory limiting mechanism is disposed between the beam deflector and the second dose cup, wherein a first opening disposed in the first trajectory limiting mechanism and a second opening disposed in the second trajectory limiting mechanism are disposed to be mutually deviated in the y direction, and wherein the second trajectory limiting mechanism allows a second beam component to enter the second dose cup by allowing passage of the second beam component having a trajectory shielded by non-opening of the first trajectory limiting mechanism among beam components having the predetermined trajectory.

22. An ion implanter comprising:
a beam deflector that deflects an ion beam incident through a previous stage beam path in a y direction by action of either or both of an electric field and a magnetic field and emits the beam to pass through a subsequent stage beam path extending in a z direction toward a wafer;
a beam filter slit that is disposed on the subsequent stage beam path between the beam deflector and the wafer, partially shields the beam traveling through the subsequent stage beam path toward the wafer, and allows passage of a beam component toward the wafer, the beam component having a predetermined trajectory among beam components of the beam passing through the subsequent stage beam path;
a first dose cup that is disposed between the beam deflector and the beam filter slit and measures a part of the beam exiting from the beam deflector; and
a trajectory limiting mechanism that is disposed between the beam deflector and the first dose cup and prevents a beam component having a trajectory deviated from the predetermined trajectory, among beam components of the beam that exits from the beam deflector and is directed toward the dose cup, from being incident to a measurement region of the first dose cup; and
a second dose cup disposed between the beam deflector and the beam filter slit, wherein the trajectory limiting mechanism is not provided between the beam deflector and the second dose cup.

23. An ion implantation method using an ion implanter, the ion implanter including:
a beam deflector that deflects an ion beam incident through a previous stage beam path in a y direction by action of either of both of an electric field and a magnetic field and outputs the beam to pass through a subsequent stage beam path extending in a z direction toward a wafer;
a beam filter slit that is disposed on the subsequent stage beam path between the beam deflector and the wafer, partially shields the beam traveling through the subsequent stage beam path toward the wafer, and allows passage of a beam component toward the wafer, the beam component having a predetermined trajectory among beam components of the beam passing through the subsequent stage beam path; and
a dose cup that is disposed between the beam deflector and the beam filter slit and measures a part of the beam exiting from the beam deflector as a beam current,
the method comprising measuring a beam incident to the dose cup through a trajectory limiting mechanism that is disposed between the beam deflector and the dose cup and prevents a first beam component having a first trajectory deviated from the predetermined trajectory, among beam components of the beam that exits from the beam deflector and is directed toward the dose cup, from being incident to a measurement region of the dose cup,
wherein the trajectory limiting mechanism includes a first mask member comprising one or more first openings and a second mask member comprising one or more second openings, the first mask member and the second mask member are disposed to face each other in the z direction and prevent a second beam component having a second trajectory other than a second trajectory capable of passing through both of the first openings and the second openings from being incident to the measurement region of the dose cup.

24. A beam measurement apparatus comprising:
a faraday cup that is capable of measuring a beam current of an ion beam; and
a trajectory limiting mechanism that is disposed in the entrance of the faraday cup and prevents a beam component having a trajectory deviated from a predetermined trajectory from being incident to a measurement region of the faraday cup,
wherein the trajectory limiting mechanism includes a first mask member having one or more first openings and a second mask member having one or more second openings, the first mask member and the second mask member are disposed to face each other in the beam traveling direction and prevent a beam component having a trajectory other than a trajectory capable of passing through both of the first openings and the second openings from being incident to the measurement region of the faraday cup.

\* \* \* \* \*